United States Patent
Kono et al.

(10) Patent No.: US 7,046,334 B2
(45) Date of Patent: May 16, 2006

(54) DISPLACEMENT CORRECTION APPARATUS, EXPOSURE SYSTEM, EXPOSURE METHOD AND A COMPUTER PROGRAM PRODUCT

(75) Inventors: Takuya Kono, Yokohama (JP); Tatsuhiko Higashiki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 10/808,300

(22) Filed: Mar. 25, 2004

(65) Prior Publication Data

US 2004/0227916 A1 Nov. 18, 2004

(30) Foreign Application Priority Data

Mar. 27, 2003 (JP) ............................ P2003-089376

(51) Int. Cl.
G03B 27/42 (2006.01)
G03B 27/58 (2006.01)
G03B 27/62 (2006.01)
G03B 27/52 (2006.01)

(52) U.S. Cl. ............................ 355/53; 355/72; 355/75; 355/55

(58) Field of Classification Search .................. 355/53, 355/72, 75, 55; 430/311
See application file for complete search history.

(56) References Cited

U.S. PATENT DOCUMENTS

| 6,169,602 B1 | 1/2001 | Taniguchi et al. ........... 356/399 |
| 6,549,271 B1 | 4/2003 | Yasuda et al. ................. 355/55 |
| 2002/0192598 A1* | 12/2002 | Hirayanagi ................... 430/311 |
| 2003/0016338 A1* | 1/2003 | Yasuda et al. ................. 355/55 |
| 2003/0090640 A1 | 5/2003 | Fujisawa et al. ............... 355/53 |
| 2003/0117599 A1 | 6/2003 | Takakuwa et al. ............. 355/53 |
| 2004/0100624 A1* | 5/2004 | Hagiwara et al. ............. 355/72 |

* cited by examiner

*Primary Examiner*—Peter B. Kim
(74) *Attorney, Agent, or Firm*—Finnegan, Henderson, Farabow, Garrett & Dunner, L.L.P.

(57) ABSTRACT

An exposure system includes, (a) an exposure apparatus, and (b) a displacement correction apparatus having a curvature information storage unit configured to store curvature information of a reticle; a displacement information calculation unit configured to calculate displacement generated in the reticle being fixed on a reticle stage of an exposure apparatus based on the curvature information; and a correction information calculation unit configured to calculate correction information for correcting a projection lens of the exposure apparatus based on the displacement.

9 Claims, 14 Drawing Sheets

DISPLACEMENT CORRECTION APPARATUS, EXPOSURE SYSTEM, EXPOSURE METHOD AND A COMPUTER PROGRAM PRODUCT

CROSS REFERENCE TO RELATED APPLICATIONS

This application is based upon and claims the benefit of priority from the prior Japanese Patent Applications No. P2003-089376, filed on Mar. 27, 2003; the entire contents of which are incorporated herein by reference.

BACKGROUND OF THE INVENTION

1. Field of the Invention

The present invention relates to technology for correcting displacement of a reticle (mask) used in lithography process. More specifically, the invention relates to a displacement correction apparatus, an exposure system, an exposure method and a displacement correction program.

2. Description of the Related Art

In a manufacturing process of semiconductors such as LSIs, lithography processes are performed a plurality of times. In general, in the lithography processes, reduction projection exposure is performed stepwise on a semiconductor wafer with an exposure apparatus, such as an aligner or a stepper using a reticle. In an inspection process after manufacturing of reticles, the absolute position of the shape and pattern of a reticle is measured so as to be standardized, and then the reticles are inspected.

However, the reticle is slightly curved in the XYZ directions. Therefore, when the curved reticle is fixed (adsorbed) on a reticle stage of the stepper by use of a vacuum chuck or the like, displacement is generated due to curvature of elements of the reticle. This displacement behaves like curved elements of a projection lens of the stepper.

Conventionally, in the inspection process after the manufacturing of reticles, the absolute position of a curved reticle, that is, a reticle in which the curved elements occur, has been measured. Therefore, secondary distortion, which occurs when the reticle with the curved elements is fixed on the reticle stage, has not been taken into consideration. Hence, especially in an exposure process where a plurality of reticles is used, errors remain attributable to the displacement of the reticles fixed on the reticle stage, thus manufacturing yield is reduced.

SUMMARY OF THE INVENTION

A feature of the present invention inheres in a displacement correction apparatus including (a) a curvature information storage unit configured to store curvature information of a reticle; (b) a displacement information calculation unit configured to calculate displacement generated in the reticle being fixed on a reticle stage of an exposure apparatus based on the curvature information; and (c) a correction information calculation unit configured to calculate correction information for correcting a projection lens of the exposure apparatus based on the displacement.

Another feature of the present invention inheres in an exposure system including (a) an exposure apparatus, and (b) a displacement correction apparatus having a curvature information storage unit configured to store curvature information of a reticle; a displacement information calculation unit configured to calculate displacement generated in the reticle being fixed on a reticle stage of an exposure apparatus based on the curvature information; and a correction information calculation unit configured to calculate correction information for correcting a projection lens of the exposure apparatus based on the displacement.

An additional feature of the present invention inheres in an exposure method including (a) measuring curvature information of a reticle; (b) calculating displacement generated in the reticle being fixed on a reticle stage of an exposure apparatus, using the curvature information; (c) calculating correction information for correcting projection lens of the exposure apparatus, using the displacement; (d) correcting the projection lens by using the correction information; and (e) exposing the reticle fixed on the reticle stage to a wafer, using the projection lens corrected.

A further feature of the present invention inheres in a computer program product for executing an application of an exposure system, the computer program product providing (a) instructions for reading curvature information of a reticle from a curvature information storage unit; (b) instructions for calculating displacement generated in the reticle being fixed on a reticle stage of an exposure apparatus, based on the curvature information; (c) instructions for calculating correction information for correcting a projection lens of the exposure apparatus, using the displacement; and (d) instructions for storing the correction information in a correction information storage unit.

DETAILED DESCRIPTION OF THE INVENTION

Figure 1:
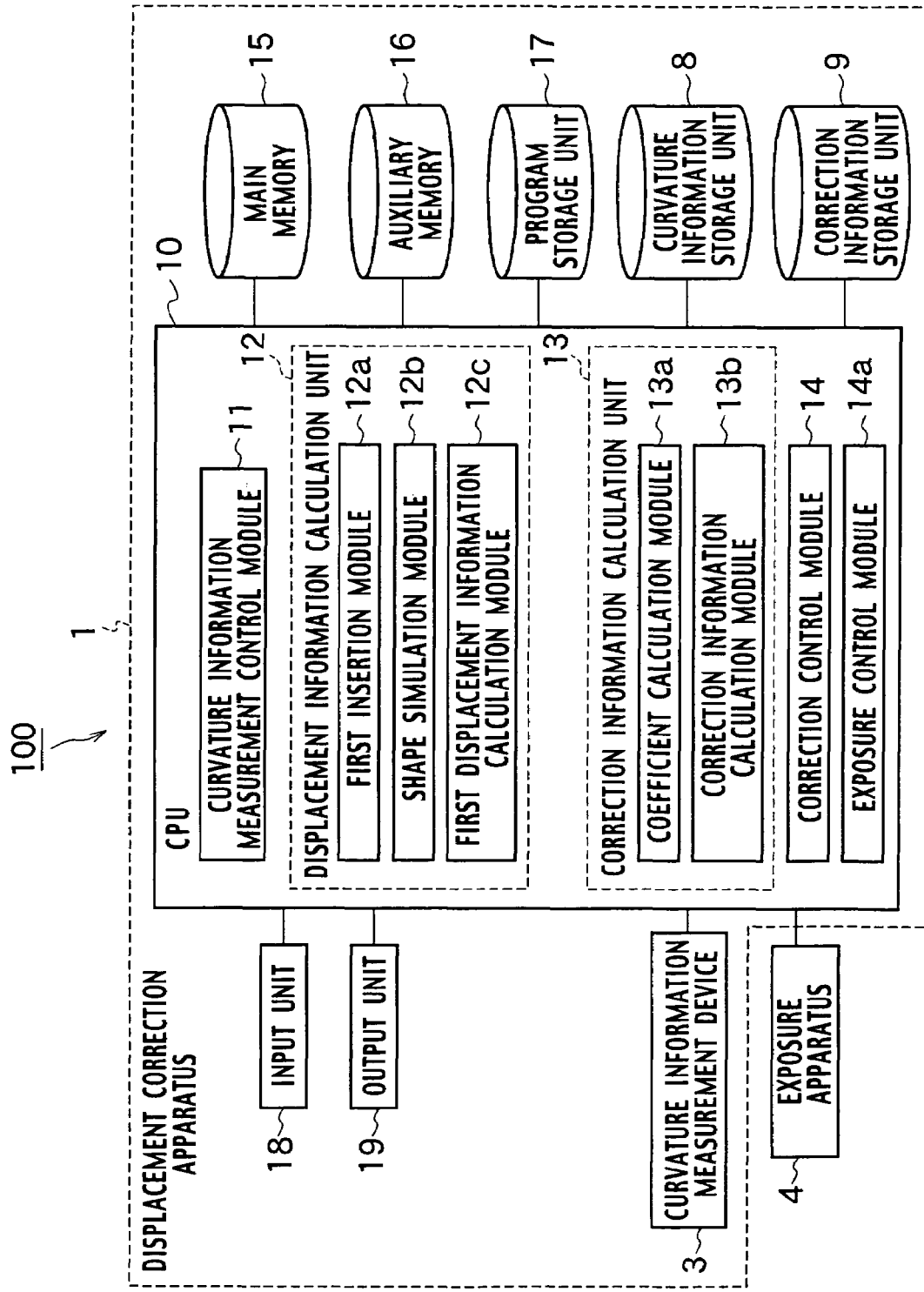
FIG. 1 is a block diagram showing an example of a configuration of an exposure system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

An exposure system 100 according to a first embodiment of the present invention includes a displacement correction apparatus 1 and an exposure apparatus (aligner or stepper) 4 as shown in FIG. 1. The displacement correction apparatus 1 includes a central processing unit (CPU) 10, a curvature information measurement device 3, a curvature information storage unit 8, a correction information storage unit 9, a main memory 15, an auxiliary memory 16, a program storage unit 17, an input unit 18, and an output unit 19.

Figure 2:
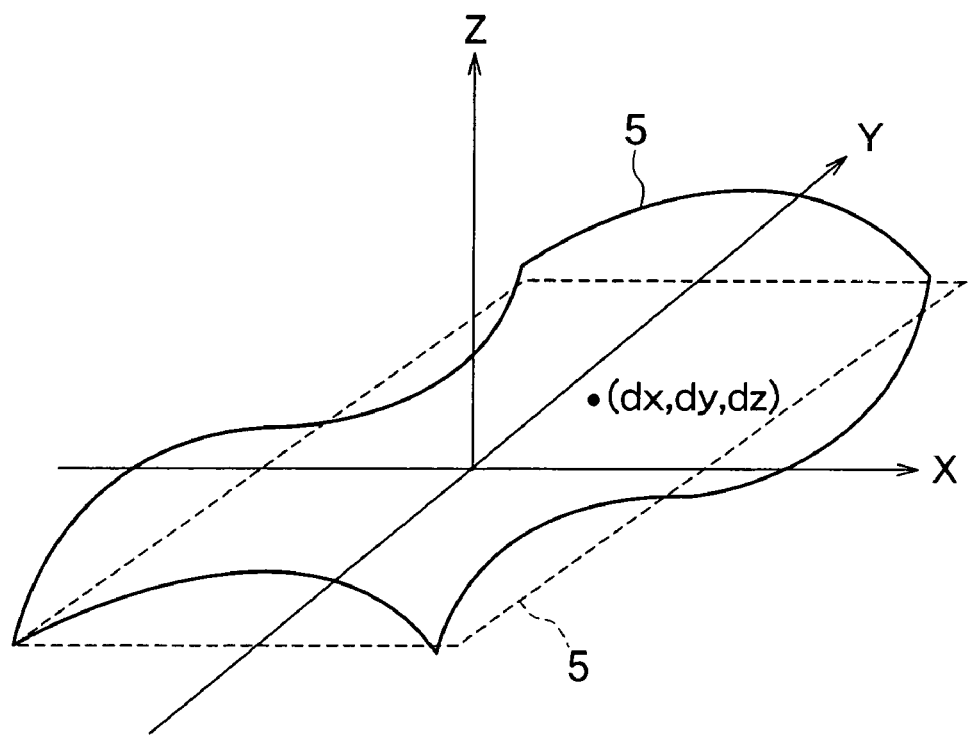
FIG. 2 is a schematic view for explaining curvature information of a reticle according to the first embodiment of the present invention.
Figure 3:
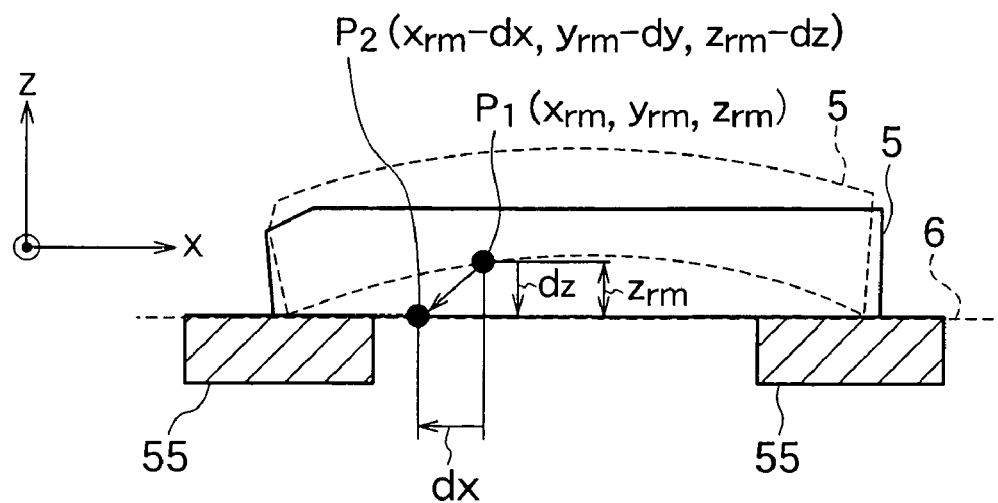
FIG. 3 is a schematic view for explaining displacement of the reticle according to the first embodiment of the present invention.

The curvature information measurement device 3 measures curvature information of a reticle 5 indicated by the solid line in FIG. 2 and by the dashed line in FIG. 3. As schematically exaggerated in FIG. 2, the reticle 5 indicated by the solid line has small curvature elements relative to an ideal plane. As schematically, and exaggeratingly, shown in FIG. 3, the curved reticle 5 indicated by the dashed line is fixed on a reticle stage 55 of the exposure apparatus 4 shown in FIG. 1 by use of a vacuum chuck or the like such that a surface with a pattern, an illustration of which is omitted, faces downwardly. At this time, a point $P_1$, the position coordinates of which are $(x_{rm}, y_{rm}, z_{rm})$, on the surface of the curved reticle 5 that is indicated by the dashed line moves to a point $P_2$, the position coordinates of which are $(x_{rm}-dx, y_{rm}-dy, z_{rm}-dz)$, on the surface of the reticle 5 when the reticle 5 is fixedly positioned on the reticle stage 55 as indicated by the solid line. Accordingly, small displacement (dx, dy, dz) is generated.

At a plurality of arbitrary points (six or more points) on the surface of the curved reticle 5, shown in FIG. 3 as indicated by the dashed line, which are defined by the coordinate system of the reticle stage 55, the curvature information measurement device 3 measures, for each point, a height (first height) $z_{rm}$ from the surface of the reticle 5 to an arbitrary first reference plane 6 defined by the coordinate system of the reticle stage 55. Here, as the "reference plane," a surface of an ideal flat plate (ideal plane). set for the reticle is selected. For example, as the ideal plane, it is possible to select a surface of an unillustrated Newton gauge with a radius of curvature of about 20 to 270 mm or more, a flatness of about 30 nm or less (three Newton rings or less), and a surface accuracy of about $\lambda/20$ to $\lambda/10$ where $\lambda$ is a wavelength of light from a light source of the curvature information measurement device 3. If the upper surface of the reticle stage 55 can be actually selected as the ideal plane, the upper surface of the reticle stage 55 can be used as the first reference plane 6. Consequently, the following are obtained as the "curvature information" on the curved reticle 5: a plurality of the first heights $z_{rm}$ from the surface of the reticle 5 to the first reference plane 6; and position coordinates $(x_{rm}, y_{rm})$ on the surface of the reticle 5 at which the respective first heights $z_{rm}$ are measured. The curvature information is stored in the curvature information storage unit 8. Note that the arbitrary points being measured by the curvature information measurement device 3 are determined based on an instruction input from the input unit 18, the type of curvature information measurement device 3, and the like. A laser interferometer, a microsensor or the like can be used as the curvature information measurement device 3.

The CPU 10 shown in FIG. 1 includes a curvature information measurement control module 11, a displacement information calculation unit 12, a correction information calculation unit 13, a correction control module 14 and an exposure control module 14a. The curvature information measurement control module 11 outputs an instruction for the curvature information measurement device 3 to measure the curvature information of the curved reticle 5 shown in FIGS. 2 and 3 and an instruction to store the measurement results in the curvature information storage unit 8.

The displacement information calculation unit 12 shown in FIG. 1 includes a first insertion module 12a, a shape simulation module 12b and a first displacement information calculation module 12c. The first insertion module 12a reads the curvature information on the curved reticle 5 and inserts coefficients $a_1$ into $f_1$ of a curved surface approximating polynomial (1) below, e.g. the quadratic polynomial below, of the curved reticle 5, as follows: the position coordinates $(x_{rm}, y_{rm})$ on the surface of the reticle 5 at which the first heights $z_{rm}$ are measured are substituted for x, y of each term in the right-hand side of the curved surface approximating polynomial (1); and the first heights $z_{rm}$ at the respective arbitrary points corresponding to the respective position coordinates $(x_{rm}, y_{rm})$ are substituted for z in the left-hand side thereof.

$$z = a_1 x^2 + b_1 y^2 + c_1 xy + d_1 x + e_1 y + f_1 \qquad (1)$$

Note that, since there are six unknowns $a_1$ to $f_1$ in the curved surface approximating polynomial (1), it is sufficient if six or more arbitrary points for measurement on the surface of the reticle 5 are selected upon measuring the curvature information of the curved reticle 5. Moreover, apart from the quadratic polynomial shown as the curved surface approximating polynomial (1) of the curved reticle 5, an n-th degree polynomial ($n \geq 3$) can be used. When an n-th degree polynomial is used, it is sufficient if the first heights $z_{rm}$ are measured at a number of points equal to or more than the number of unknowns that are coefficients of respective terms of the n-th degree polynomial.

Figure 4:
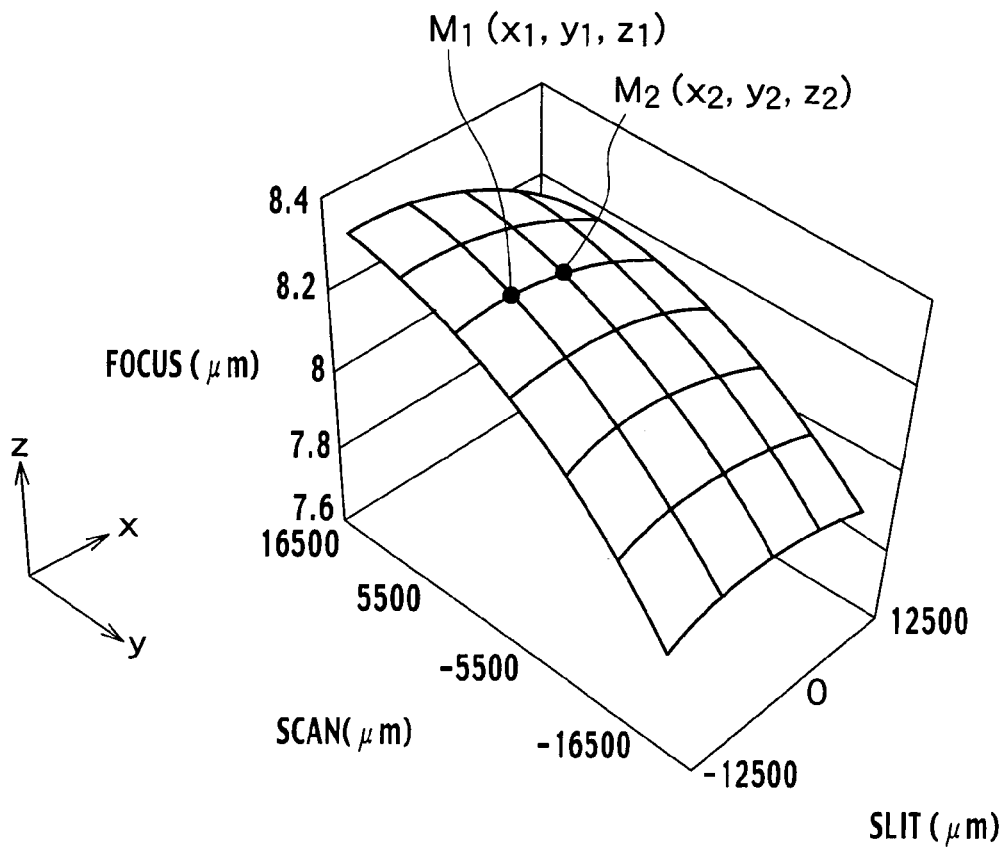
FIG. 4 is a schematic view for explaining simulating a shape of the reticle according to the first embodiment of the present invention.

The shape simulation module 12b simulates the shape of the surface of the curved reticle 5 in the following manner: position coordinates $(x_{fr}, y_{fr})$ of a plurality of arbitrary points in the entire area of the reticle stage 55 (for example, 25 mm in the X direction×33 mm in the Y direction) are substituted in the curved surface approximating polynomial (1) where the coefficients $a_1$ to $f_1$ have been inserted; and first heights $z_{fr}$ are calculated. Here, using the position coordinates $(x_{fr}, y_{fr})$ of the arbitrary points on the surface of the curved reticle 5 and the first heights $z_{fr}$ at the arbitrary points, a three-dimensional shape of the surface can be simulated as shown in FIG. 4. In FIG. 4, the X axis shows positions of the curved surface in the slit direction, which are defined on the reticle stage 55, the Y axis shows positions in the scanning direction, and the Z axis shows positions in the focusing direction. Note that, for the position coordinates of the arbitrary points to be substituted in the curved surface approximating polynomial (1) of the reticle 5 by the shape simulation module 12b, the position coordinates ($x_{rm}$, $y_{rm}$) on the surface of the reticle 5, which have been measured by the curvature information measurement device 3, may be used in common, or different coordinates from the position coordinates ($x_{rm}$, $y_{rm}$) may be used.

The first displacement information calculation module 12c shown in FIG. 1 calculates, based on the position coordinates ($x_{fr}$, $y_{fr}$) of the arbitrary points obtained by the shape simulation module 12b and the first heights $z_{fr}$ at the arbitrary points, displacement (dx, dy) which is generated as shown in FIG. 3 because the curvature originally observed on the curved reticle 5 is flattened. Here, the curvature is flattened when the curved reticle 5 is fixed on the reticle stage 55 by use of a vacuum chuck or the like to be forcibly flattened. The first displacement information calculation module 12c may calculate the displacement (dx, dy) based on the actually measured first heights $z_{rm}$ and the position coordinates ($x_{rm}$, $y_{rm}$) on the surface of the reticle 5 at which the first heights $z_{rm}$ are measured, instead of the position coordinates ($x_{fr}$, $y_{fr}$) of the arbitrary points obtained by the shape simulation module 12b and the first heights $z_{fr}$ at the arbitrary points.

Figure 5:
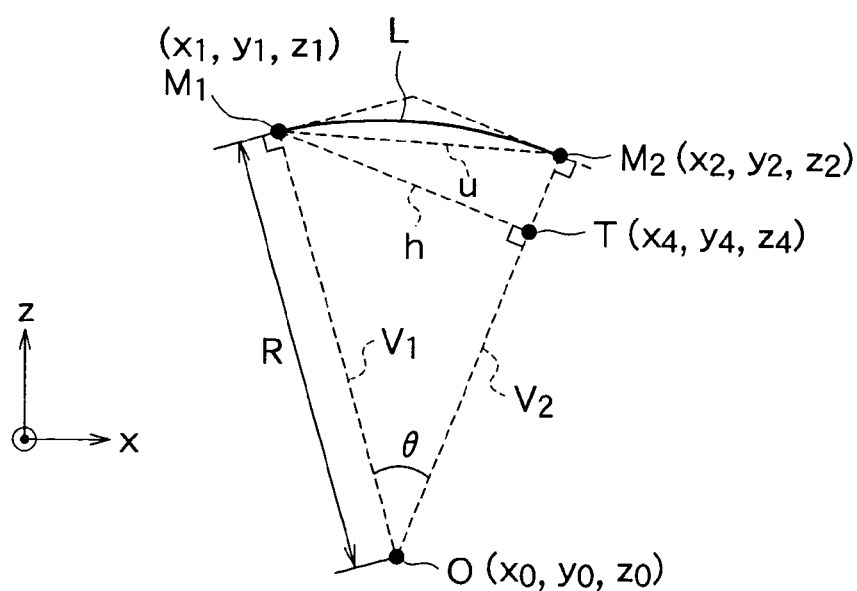
FIGS. 5 and 6 are schematic views for explaining an example of a method for calculating the displacement of the reticle according to the first embodiment of the present invention.

Herein, a description will be given of an example of a method of calculating, by the first displacement information calculation module 12c, the displacement (dx, dy) between two arbitrary points $M_1$ and $M_2$ shown in FIGS. 4 and 5. In FIG. 5, an arc $M_1M_2$ shows a part of the shape of the curved surface of the curved reticle 5, and a line segment $M_1M_2$ shows a part of the shape of the surface of the reticle 5 which is fixed on the reticle stage 55 and forcibly flattened.

(a) First, arbitrary coordinate values of a central point O are selected. For example, the curved surface approximating polynomial (1) of the reticle 5 where the coefficients $a_1$ to $f_1$ have been inserted is partially differentiated by x, y. Then, a position coordinate $x_1$ in the X direction of the arbitrary point $M_1$ is substituted in the curved surface approximating polynomial (1) partially differentiated by x, thereby obtaining a tangent in the X direction. Similarly, a position coordinate $y_1$ in the Y direction of the arbitrary point $M_1$ is substituted for y in the curved surface approximating polynomial (1) partially differentiated by y, thereby obtaining a tangent in the Y direction. Subsequently, a first normal $V_1$ which is perpendicular to a plane including the tangents in the XY directions and passing the arbitrary point $M_1$ is obtained. Similarly to the case of the arbitrary point $M_1$, a second normal $V_2$ is obtained for the arbitrary point $M_2$. A point with coordinate values of ($x_0$, $y_0$, $z_0$) where the first and second normals $V_1$ and $V_2$ intersect with each other may be set as the central point O shown in FIG. 5. The central point O is a point to be the center of a circle including the arc $M_1M_2$ as a part of the circular arc thereof.

(b) Next, a radius of curvature R defined by the lengths of line segments $OM_1$ and $OM_2$ is obtained from the coordinate values ($x_0$, $y_0$, $z_0$) of the central point O, the coordinate values ($x_1$, $y_1$, $z_1$) of the arbitrary point $M_1$, and the coordinate values ($x_2$, $y_2$, $z_2$) of the arbitrary point $M_2$. In addition, coordinate values ($x_4$, $y_4$, $z_4$) of a point T, the intersection point of a perpendicular from the arbitrary point $M_1$ on the line segment $OM_2$, are obtained. Using a length h of a line segment $M_1T$ and the radius of curvature R, a curvature angle θ between the line segments $OM_1$ and $OM_2$ is obtained by a trigonometric function. A length L of an arc between the two arbitrary points $M_1$ and $M_2$ is calculated using the radius of curvature R and the curvature angle θ.

Here, if the curvature is extremely small, it can be determined that the curvature angle θ is small. Therefore, the length L of the arc between the two arbitrary points $M_1$ and $M_2$ can be approximated by L=Rθ.

Figure 6:
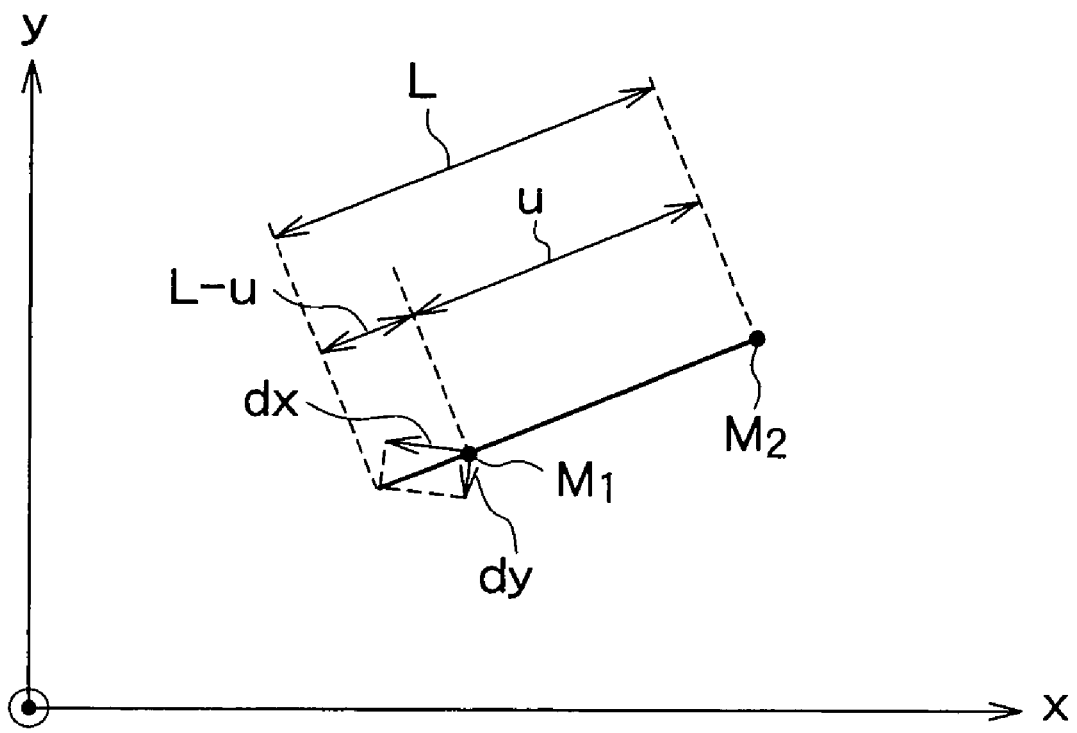

(c) Thereafter, a length L-u, a difference between the length L of the arc between the two arbitrary points $M_1$ and $M_2$ and a length u of the line segment between the two arbitrary points $M_1$ and $M_2$, is calculated. As shown in FIG. 6 where the horizontal axis shows the slit positions and the vertical axis shows the scan positions, the length L-u of the difference is resolved into elements in the X and Y directions using the position coordinates ($x_1$, $y_1$), ($x_2$, $y_2$) of the two arbitrary points $M_1$ and $M_2$. The length L-u is thus calculated as the displacement (dx, dy) in the XY directions that are generated, relative to the point $M_1$ or $M_2$ on the surface of the curved reticle 5, when the curved reticle 5 is fixed on the reticle stage 55 and forcibly flattened. Similarly, the displacement (dx, dy) as shown in FIG. 6 are calculated for each two points among the plurality of arbitrary points.

Note that, although FIG. 6 shows a case where the displacement (dx, dy) are generated at the arbitrary point $M_1$ side, it can be assumed that the displacement (dx, dy) are generated at the arbitrary point $M_2$ side. Alternatively, it can be assumed that the displacement (dx, dy) are generated at both of the two arbitrary points $M_1$ and $M_2$ with half values for each point. In this way, the displacement (dx, dy) can be appropriately set.

The correction information calculation unit 13 shown in FIG. 1 includes a coefficient calculation module 13a and a correction information calculation module 13b. The coefficient calculation module 13a reads the calculated displacement (dx, dy) and calculates coefficients $k_1$ to $k_{20}$ of a first displacement correction polynomial (2) and a second displacement correction polynomial (3) intersecting at a right angle with dx, which are the below identified cubic polynomials for correcting a projection lens 54. The position coordinates of one of the two arbitrary points are substituted for x, y of each term in the respective right-hand sides of the first and second displacement correction polynomials (2) and (3), and displacement (dx, dy) between the two arbitrary points are substituted for dx, dy in the respective left-hand sides thereof.

$$dx=k_1+xk_3+yk_5+x^2k_7+xyk_9+y^2k_{11}+x^3k_{13}+x^2yk_{15}+xy^2k_{17}+y^3k_{19} \qquad (2)$$

$$dy=k_2+yk_4+xk_6+y^2k_8+xyk_{10}+x^2k_{12}+y^3k_{14}+xy^2k_{16}+x^2yk_{18}+x^3k_{20} \qquad (3)$$

Here, the coefficients $k_1$ to $k_{20}$ are parameters to show distortion (displacement) elements in the projection lens 54, a wafer and the reticle stage 55. The position coordinates to be substituted for x, y of each term in the right-hand sides may be, for example, appropriately selected mean values of the position coordinates of the two arbitrary points.

Figure 7:
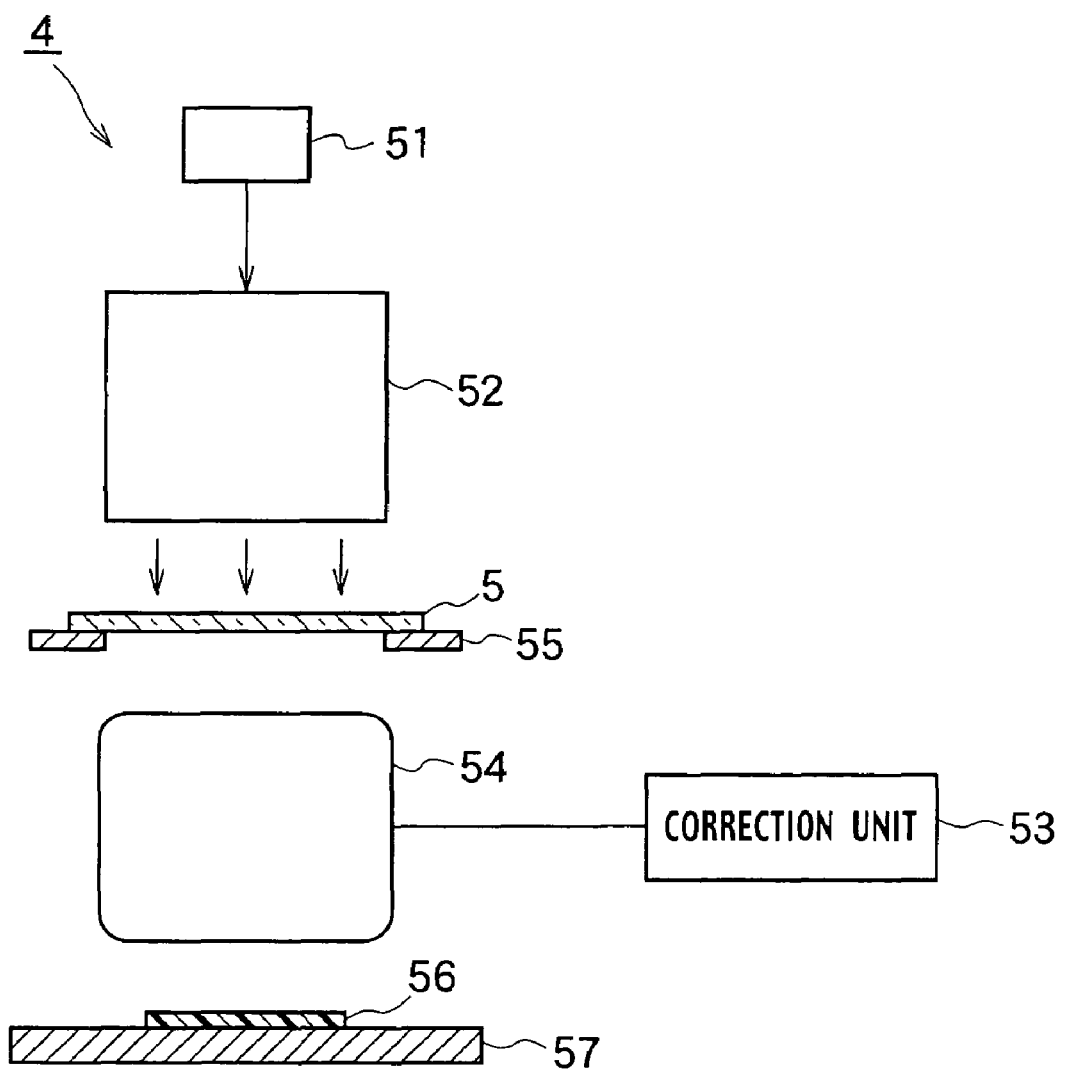
FIG. 7 is a schematic view showing an example of a configuration of an exposure apparatus (aligner or stepper) according to the first embodiment of the present invention.

The correction information calculation module 13b shown in FIG. 1 calculates correction information on the projection lens 54 of the exposure apparatus 4 shown in FIG. 7 using the curved surface approximating polynomial (1) or the coefficients $k_1$ to $k_{20}$ of the first and second displacement correction polynomials (2) and (3), and stores the correction information in the correction information storage unit 9. The correction information for the projection lens 54 includes a driving position of the projection lens 54, a driving force thereof, and the like. As shown in FIG. 7, the exposure apparatus 4 includes a light source 51 for irradiating exposure light; an illumination system including a condenser lens 52; the reticle stage 55 on which the reticle 5 is fixed; a projection optics system including the projection lens 54 made up of a plurality of lenses; and a substrate stage 57 on which a wafer 56 is fixed. A correction unit 53 for correcting the driving force and driving position of the projection lens 54 is connected to the projection lens 54.

The correction control module 14 shown in FIG. 1 outputs an instruction for the correction unit 53 of the exposure apparatus 4 shown in FIG. 7 to correct the driving force and driving position of the projection lens 54, using the correction information calculated by the correction information calculation module 13b. The exposure control module 14a outputs an instruction to drive the exposure apparatus 4 to provide on exposure. The exposure apparatus 4 then irradiates exposure light from the light source 51, and, through the condenser lens 52, the reticle 5 fixed on the reticle stage 55, and the projection lens 54 corrected by the correction unit 53, transfers a pattern of the reticle 5 to the wafer 56 fixed on the substrate stage 57. At this time, since the driving force and driving position of the projection lens 54 have been corrected, the pattern of the reticle 5 can be transferred to the wafer 56 without errors such as deviation of the transferred pattern attributable to the displacement of the reticle 5.

The curvature information storage unit 8 shown in FIG. 1 stores the curvature information measured by the curvature information measurement device 3. The correction information storage unit 9 stores the correction information calculated by the correction information calculation module 13b. The main memory 15 stores results calculated by the CPU 10 stepwise. The stored results are read from the main memory 15 when required. A hard disk, which can store various kinds of information such as QC information of the reticle 5, can be used as an auxiliary memory 16.

The program storage unit 17 stores a displacement correction program for executing applications on the displacement correction apparatus 1. The displacement correction program includes an instruction to read the curvature information of the curved reticle 5 stored in the curvature information storage unit 8; an instruction to calculate the displacement (dx, dy) generated in fixing of the reticle 5 on the reticle stage 55 of the exposure apparatus 4 by use of the curvature information of the curved reticle; an instruction to calculate the correction information for correcting the projection lens 54 of the exposure apparatus 4, using the displacement (dx, dy); an instruction to store the correction information in the correction information storage unit 9; and the like. The displacement correction program is executed by the CPU 10. As the input unit 18, for example, a keyboard, a mouse, a voice device, or the like can be used. The output unit 19 may be such as a liquid crystal display (LCD), a CRT display, a printer, or the like.

A description will be given of an example of an exposure method according to the first embodiment of the present invention referring to FIGS. 1 to 8. Note that results calculated in the respective following steps are stored stepwise in the main memory 15 shown in FIG. 1, and read as needed.

Figure 8:
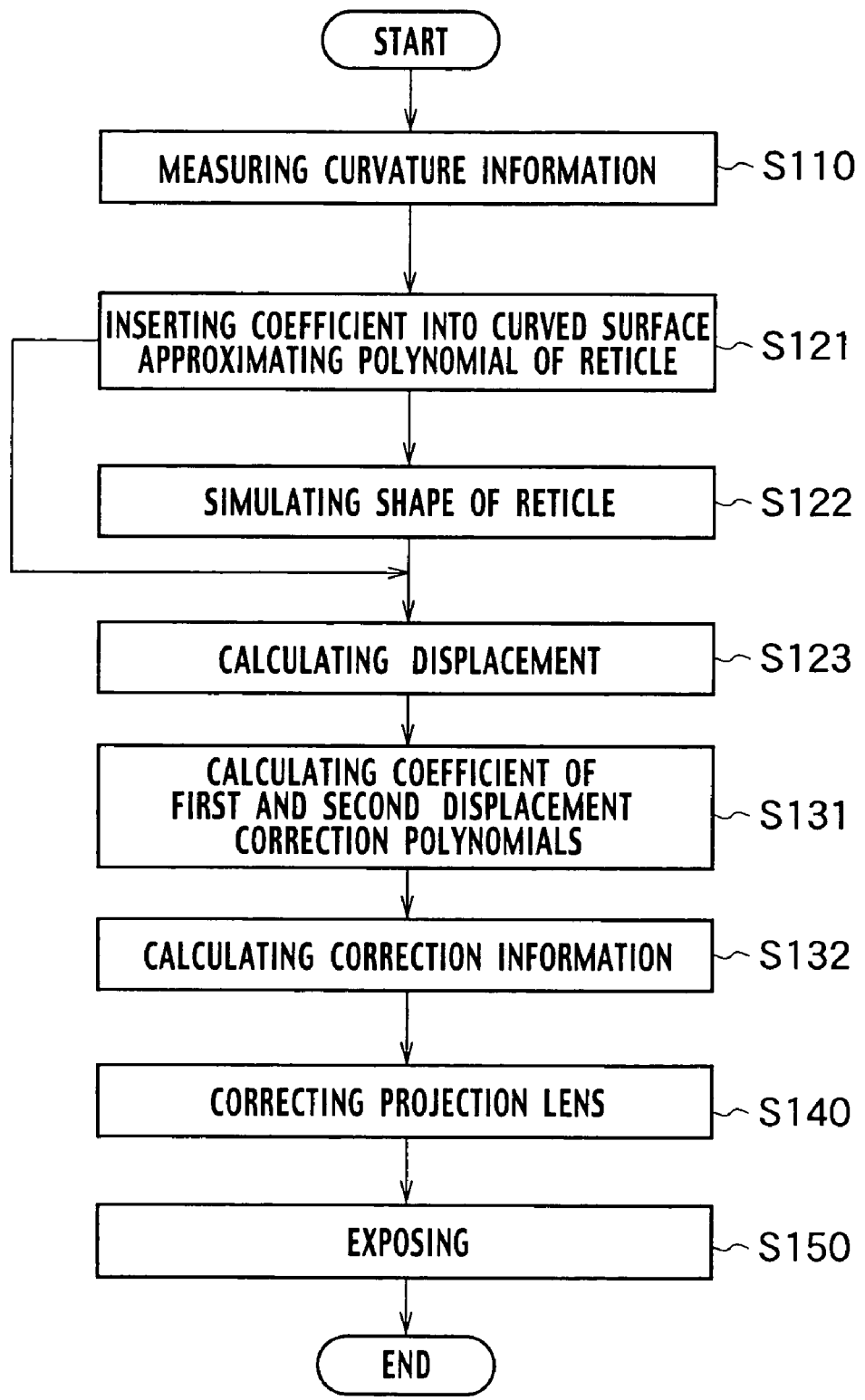
FIG. 8 is a flowchart for explaining an example of an exposure method according to the first embodiment of the present invention.

(a) In step S110 of FIG. 8, the curvature information measurement control module 11 shown in FIG. 1 controls the curvature information measurement device 3 to measure first heights $z_{rms}$ extending from the surface of the curved reticle 5 to the first reference plane 6 at a plurality of arbitrary points (six or more points). As a result, the first heights $z_{rm}$ measured from the reticle 5 to the first reference plane 6 and position coordinates $(x_{rm}, y_{rm})$ at which the first heights $z_{rm}$ are measured on the surface of the reticle 5 are obtained as "curvature information".

(b) In step S121, the first insertion module 12a reads the curvature information measured by the curvature information measurement device 3, and inserts coefficients $a_1$ to $f_1$ into the curved surface approximating polynomial (1) of the reticle 5 by substituting the first heights $z_{rm}$ and the position coordinates $(x_{rm}, y_{rm})$ on the surface of the reticle 5, for which first heights $z_{rm}$ have been measured for the curved surface approximating polynomial (1) of the reticle 5.

(c) In step S122, the shape simulation module 12b simulates the surface shape of the reticle 5 by calculating first heights $z_{fr}$ corresponding to the position coordinates $(x_{fr}, y_{fr})$ at a plurality of arbitrary points in a range of the reticle stage 55 using the curved surface approximating polynomial (1) of the reticle 5 to which the coefficients $a_1$ to $f_1$ have been inserted.

(d) In step S123, the first displacement information calculation module 12c calculates displacement (dx, dy) generated due to the originally observed curvature on the reticle 5 is being flattened when the curved reticle 5 is fixed on the reticle stage 55, using of the curved surface approximating polynomial (1) of the reticle 5 to which the coefficients $a_1$ to $f_1$ have been inserted.

(e) In step S131, the coefficient calculation module 13a reads the displacement (dx, dy) calculated by the first displacement information calculation module 12c, and calculates coefficients $k_1$ to $k_{20}$ of the first and second displacement correction polynomials (2) and (3) of the projection lens 54 by substituting one of position coordinates $(x_1, y_1)$ and $(x_2, y_2)$ at respective arbitrary points, and displacement (dx, dy) between each arbitrary points in the first and second displacement correction polynomials (2) and (3).

(f) In step S132, the correction information calculation module 13b calculates correction information of the projection lens 54 shown in FIGS. 1 and 7, using the coefficients $k_1$ to $k_{20}$ of the first and second displacement correction polynomials (2) and (3) calculated by the coefficient calculation module 13a, QC information of the reticle 5 stored in the auxiliary memory 16 and the like. The correction information of the projection lens 54 is stored in the correction information storage unit 9.

(g) In step S140, the correction control module 14 controls the correction unit 53 showed in FIG. 7 to correct a driving force and a driving position of the projection lens 54, using of the correction information. As a result, errors attributable to the displacement (dx, dy) of the reticle 5 are corrected.

(h) In step S150, the exposure control module 14a drives the exposure apparatus 4 shown in FIG. 7 to irradiate exposure light from the light source 51 with the corrected projection lens 54, and a pattern of the flattened reticle 5 is transferred to the wafer 56 on the wafer stage 57. At this time, since errors attributable to the displacement of the reticle 5 have been corrected, exposing can be performed without errors such as a deviation of the transferred pattern attributable to the displacement of the reticle 5. The steps of the exposure method according to the first embodiment of the present invention are not limited to the above-described steps S110 to S150.

According to the first embodiment of the present invention, the displacement (dx, dy) attributable to the curvature of the reticle 5, generated when the curvature is fixed on the reticle stage 55 and flattened, can be predicted prior to an exposure process. Therefore, errors due to displacement (dx, dy) of the reticle 5 can be corrected, and manufacturing yield can be improved.

SECOND EMBODIMENT

Figure 9:
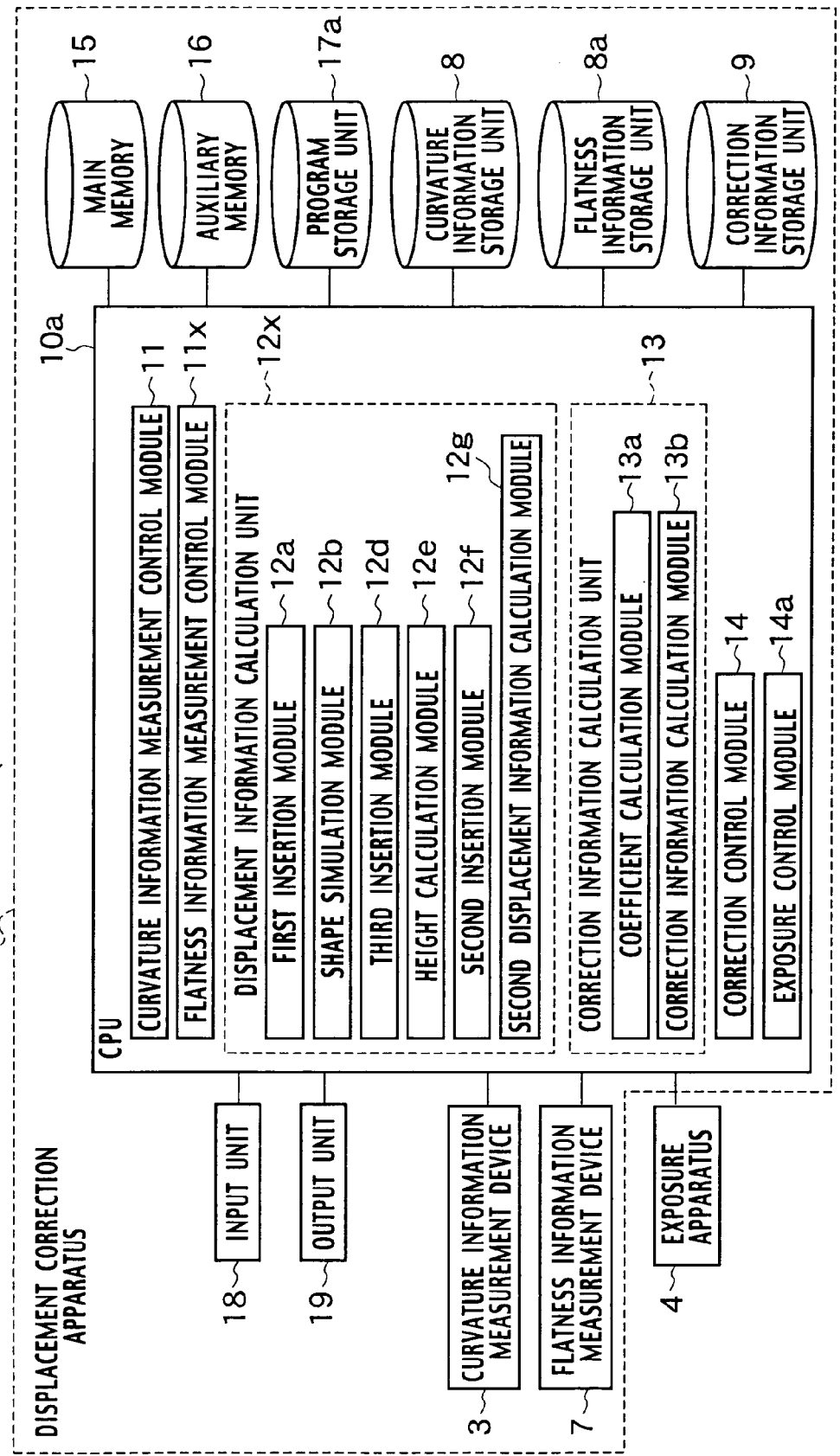
FIG. 9 is a block diagram showing an example of a configuration of an exposure system according to a second embodiment of the present invention.

An exposure system 100a according to a second embodiment of the present invention includes a displacement correction apparatus 1a and an exposure apparatus (aligner or stepper) 4 as shown in FIG. 9. A description will be given of a system, as the exposure system 100a according to the second embodiment of the present invention, where flatness information of the reticle stage 55 is taken into consideration in addition to the curvature information of the reticle 5.

Figure 10:
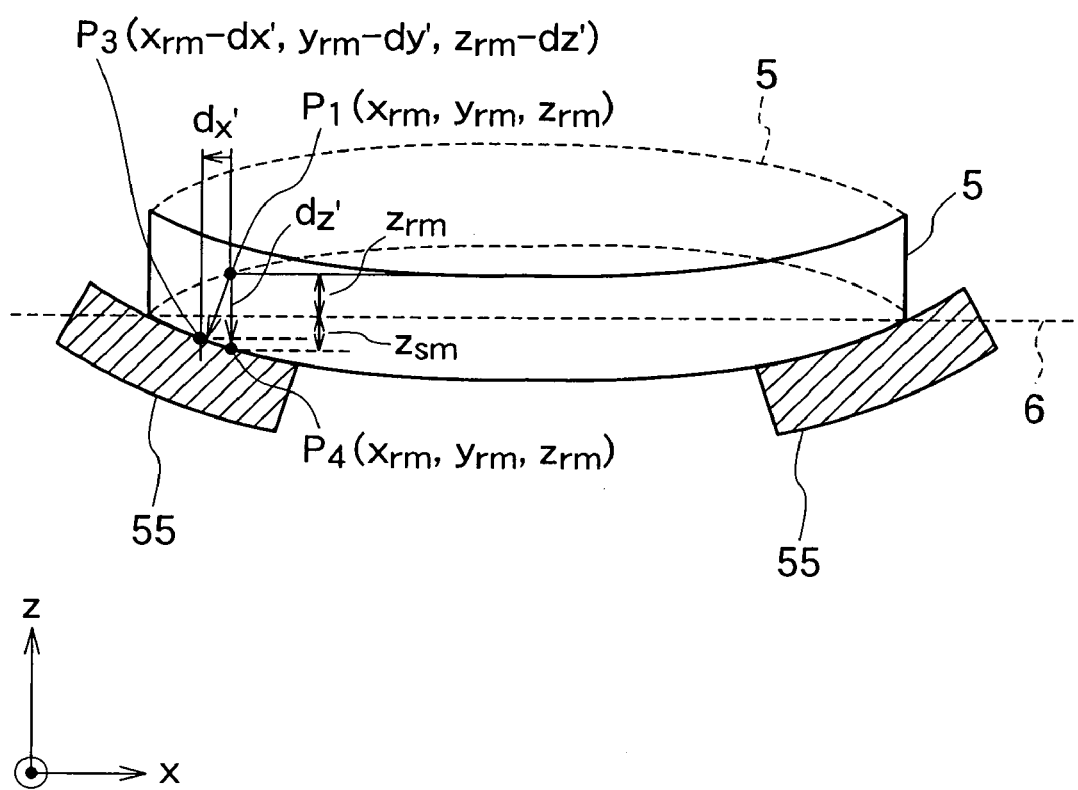
FIG. 10 is a sectional view for explaining flatness information of a reticle stage according to the second embodiment of the present invention.

As schematically enhanced in FIG. 10, a surface of the reticle stage 55 is actually slightly inclined relative to an ideal plane and has an unevenness. When the curved reticle 5 as indicated by the dashed line is fixed on the actual surface of the reticle stage 55 so as to be adhered thereto, a point P on the reticle 5 at coordinate positions $(x_{rm}, y_{rm}, z_{rm})$ moves to coordinate positions $(x_{rm}-d'x, y_{rm}-d'y, z_{rm}-d'z)$ such that the reticle 5 is adhered to the actual surface of the reticle stage 55. In other words, displacement (d'x, d'y, d'z) is shifted from the displacement (dx, dy, dz) shown in FIG. 3 by the unevenness and inclination of the surface of the reticle stage 55 relative to the ideal plane. Here, the displacement (d'x, d'y, d'z) is generated when the shape of the curved reticle 5 is adhered to the reticle stage 55 having an uneven and inclined surface. Moreover, the displacement (dx, dy, dz) is generated when the original curvature of the reticle 5 is flattened. In the above case, the displacement (d'x, d'y) in the XY directions is extremely small. Therefore, the displacement d'z in the height direction at the coordinate positions $(x_{rm}, y_{rm})$ can be approximated to a deviation of an amount of height change at the coordinate positions $(x_{rm}, y_{rm})$, from the surface of the flat reticle 5 to a height (second height) $z_{sm}$ of the actual uneven and inclined surface of the reticle stage 55 by the addition of a height change from the surface of the curved reticle 5, as indicated by the dashed line, to the height (first height) $z_{rm}$ of the surface of the flat reticle 5.

The displacement correction apparatus 1a shown in FIG. 9 includes a CPU 10a, a curvature information measurement device 3, a flatness information measurement device 7, a curvature information storage unit 8, a flatness information storage unit 8a, a correction information storage unit 9, a main memory 15, an auxiliary memory 16, a program storage unit 17a, an input unit 18 and an output unit 19, all of which are connected to the CPU 10a.

The flatness information measurement device 7 measures, at a plurality of arbitrary points, the heights (second height) $z_{sm}$ from the actual surface of the reticle stage 55 used in the exposure apparatus 4 to a second reference plane 6 set for the reticle stage 55. A laser interferometer or the like can be used as the flatness information measurement device 7. As the second reference plane 6 set for the reticle stage 55, as shown in FIG. 10, the ideal plane which is the first reference plane 6 set for the reticle 5, can be selected. The respective second heights $z_{sm}$ of the plurality of arbitrary points measured by a flatness information measurement module 11x, and the respective position coordinates $(x_{rm}, y_{rm})$ on the surface of the reticle stage 55 at which the second heights $z_{sm}$ are measured, are obtained as the "flatness information." The flatness information is stored in the flatness information storage unit 8a.

The CPU 10a is different from the CPU 10 shown in FIG. 1 in that the CPU 10a further includes the flatness information measurement module 11x and a displacement information calculation unit 12x. The flatness information measurement module 11x outputs an instruction for the flatness information measurement device 7 to measure the flatness information of the reticle stage 55, and to store the flatness information in the flatness information storage unit 8a.

The displacement information calculation unit 12x includes a first insertion module 12a, a shape simulation module 12b, a third insertion module 12d, a height calculation module 12e, a second insertion module 12f, and a second displacement information calculation module 12g. The first insertion module 12a reads the curvature information of the curved reticle 5. Then, using the first heights $z_{rm}$ from the surface of the curved reticle 5 to the first reference plane 6 and the position coordinates $(x_{rm}, y_{rm})$ on the surface of the reticle 5 at which the first heights $z_{rm}$ are measured, the first insertion module 12a inserts the coefficients $a_1$ to $f_1$ into the curved surface approximating polynomial (1).

The third insertion module 12d reads the flatness information on the reticle stage 55. Then, the third insertion module 12d substitutes the second heights $z_{sm}$, which are measured relative to the second reference plane 6, and the position coordinates $(x_{rm}, y_{rm})$, which are on the surface of the reticle stage 55 and at which the second heights $z_{sm}$ are measured, in the following quadratic polynomial, a curved surface approximating polynomial (4) of the reticle stage 55. In this way, coefficients $a_2$ to $f_2$ of the curved surface approximating polynomial (4) of the reticle stage 55 are inserted.

$$z = a_2 x^2 + b_2 y^2 + c_2 xy + d_2 x + e_2 y + f_2 \quad (4)$$

The shape simulation module 12b simulates the shape of the surface of the curved reticle 5 by substituting position coordinates $(x_{fr}, y_{fr})$ of a plurality of arbitrary points in the curved surface approximating polynomial (1) where the coefficients $a_1$ to $f_1$ have been inserted, and calculating first heights $z_{fr}$ from the surface of the curved reticle 5 to the first reference plane 6. Moreover, the shape simulation module 12b simulates the shape of the actual surface of the reticle stage 55 by substituting the position coordinates $(x_{fr}, y_{fr})$ of the plurality of arbitrary points in the curved surface approximating polynomial (4) of the reticle stage 55 where the coefficients $a_2$ to $f_2$ have been inserted, and calculating second heights $z_{sf}$ from the surface of the reticle stage 55 to the second reference plane 6.

The height calculation module 12e reads the first and second heights $z_{fr}$ and $z_{sf}$ obtained by the shape simulation module 12b, and calculates third heights $z_{rsf}$, each obtained by subtracting the second height $z_{sf}$ from the first height $z_{fr}$ at the same position coordinates $(x_{fr}, y_{fr})$. Moreover, the height calculation module 12e can calculate, by reading the curvature information on the curved reticle 5 measured relative to the first reference plane 6 and the flatness information on the reticle stage 55 measured relative to the second reference plane 6, the third heights $z_{rsm}$, each obtained by subtracting the second height $z_{sm}$ from the first height $z_{rm}$, measured at the same position coordinates $(x_{rm}, y_{rm})$. The calculation may be simplified if the first and second reference planes 6 are the identical ideal plane.

The second insertion module 12f substitutes the position coordinates $(x_{rm}, y_{rm})$ of the arbitrary points in the right-hand side of the following curved surface approximating polynomial (5) of the reticle 5 where the flatness of the reticle stage 55 is considered. Then, the second insertion module 12f substitutes the third heights $z_{sm}$ at the arbitrary points in the left-hand side thereof, thereby inserting coefficients $a_3$ to $f_3$ into the curved surface approximating polynomial (5) when the flatness of the reticle stage 55 is considered.

$$z = a_3 x^2 + b_3 y^2 + c_3 xy + d_3 x + e_3 y + f_3 \quad (5)$$

Note that the second insertion module 12f can insert, by use of the third heights $z_{rsm}$ obtained by subtracting the measured second heights $z_{sm}$ from the measured first heights $z_{rm}$ and by the common position coordinates $(x_{rm}, y_{rm})$ at which the first and second heights $z_{rm}$ and $z_{sm}$ are measured, the coefficients $a_3$ to $f_3$ of the curved surface approximating polynomial (5) of the reticle 5 where the flatness of the reticle stage 55 is considered.

The first displacement information calculation module 12c calculates the displacement (d'x, d'y) in the XY directions, using the curved surface approximating polynomial (5) where the coefficients $a_3$ to $f_3$ have been inserted and the flatness of the reticle stage 55 is considered. The displacement (d'x, d'y) is generated because the shape of the curvature which the reticle 5 originally had is changed by being adhered to the reticle stage 55 when the reticle 5 is fixed on the reticle stage 55 so as to be adhered to the actual surface of the reticle stage 55.

The flatness information storage unit 8a stores the flatness information measured by the flatness information measurement device 7. The program storage unit 17a stores a displacement correction program for executing applications on the displacement correction apparatus 1a. The displacement correction program includes an instruction to read the flatness information of the reticle stage 55 stored in the flatness information storage unit 8a; an instruction to calculate the third heights $z_{rsf}$, and the like. Since another part of the exposure system 100a is substantially the same as the displacement correction apparatus 1 shown in FIG. 1, repeated explanation is omitted.

A description will be given of an exposure method according to the second embodiment of the present invention referring to FIGS. 9 to 11.

Figure 11:
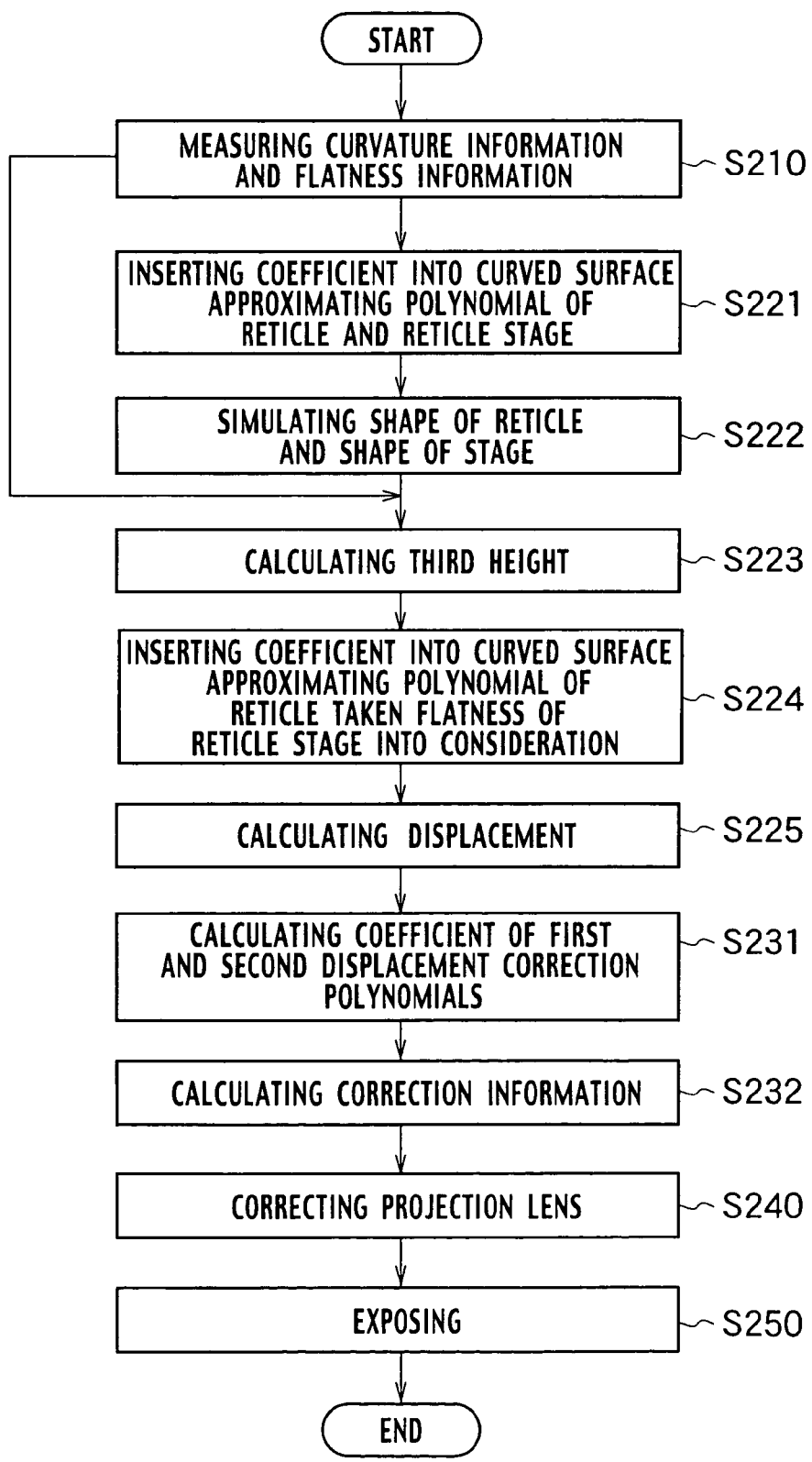
FIG. 11 is a flowchart for explaining an example of an exposure method according to the second embodiment of the present invention.

(a) In step S210 of FIG. 11, the curvature information measurement control module 11 shown in FIG. 9 controls the curvature information measurement device 3 to measure the curvature information of the curved reticle 5. Since step S210 is substantially the same as step S110 shown in FIG. 8, repeated explanation is omitted. As shown in FIG. 10, the flatness information measurement control module 11x controls the flatness information measurement device 7 to measure the position coordinates $(x_{rm}, y_{rm})$ at a plurality of arbitrary points (six or more points) and second heights $z_{sm}$ from the surface of the reticle stage 55 to the second reference plane 6 at the arbitrary points, as the flatness information.

(b) In step S221, the first insertion module 12a reads the curvature information of the curved reticle 5 in step S210, and inserts the coefficients $a_1$ to $f_1$ by substituting the first heights $z_{rm}$ measured relative to the first reference plane 6 and the position coordinates $(x_{rm}, y_{rm})$ on the surface of the reticle 5 at which the first heights $z_{rm}$ are measured in the curved surface approximating polynomial (1). In addition, the third insertion module 12d inserts the coefficients $a_2$ to $f_2$ into the curved surface approximating polynomial of (4) of the reticle stage 55 by substituting the second heights $z_{sm}$ and the position coordinates $(x_{rm}, y_{rm})$ on the surface of the reticle stage 55 at which the second heights $z_{sm}$ are measured in the curved surface approximating polynomial (4), by use of the flatness information of the reticle stage 55 measured in step S210.

(c) In step S222, the shape simulation module 12b calculates first heights $z_{fr}$ by substituting the position coordinates $(x_{fr}, y_{fr})$ at a plurality of arbitrary points for the curved surface approximating polynomial (1) in which the coefficients $a_1$ to $f_1$ have been inserted. Then, the shape simulation module 12b simulates the surface shape curvature of the reticle 5. Furthermore, the shape simulation module 12b calculates the second heights $z_{sf}$ by substituting the position coordinates $(x_{fr}, y_{fr})$ at a plurality of arbitrary points for the curved surface approximating polynomial (4) in which the coefficients $a_2$ to $f_2$ are inserted. Then, the shape simulation module 12b simulates the actual shape of the surface of the reticle stage 55.

(d) In step S223, the third height calculation module 12e calculates third heights $z_{rsf}$, which are obtained by subtracting the second heights $z_{sf}$ from the first heights $z_{rs}$ at arbitrary points of the same position coordinates respectively calculated in step S222. In addition, the third height calculation module 12e can calculate third heights $z_{rsm}$ by subtracting the second heights $z_{sm}$ from the first heights $z_{rm}$ at the same position coordinates measured in step S210.

(e) In step S224, the second insertion module 12f inserts the coefficients $a_3$ to $f_3$ corresponding to the reticle 5 by substituting the position coordinates $(x_{fr}, y_{fr})$ corresponding to the third heights $z_{rsf}$ calculated in step S222 for the curved surface approximating polynomial (5) of the reticle 5 when the flatness of the reticle stage 55 is considered. Note that in step S224, the first insertion module 12a may insert the coefficients $a_3$ to $f_3$ by substituting the position coordinates $(x_{fr}, y_{fr})$ corresponding to the measured third heights $z_{rsf}$ by subtracting the second height $z_{sm}$ from the first heights $z_{rm}$ which are calculated in step S210 for the curved surface approximating polynomial (5) of the reticle 5, in which the flatness of the reticle stage 55 is taken into account.

(f) In step S225, the second displacement information calculation module 12g calculates the displacement (d'x, d'y) between a plurality of arbitrary points on the originally curved reticle 5 when the reticle 5 is fixedly adhered on the reticle stage 55, using the curved surface approximating polynomial (5) of the reticle 5 with the flatness of the reticle stage 55 taken into consideration in which the coefficients $a_3$ to $f_3$ have been inserted. The method for calculating the displacement (d'x, d'y) by the second displacement information calculation module 12g is similar to the method for calculating the displacement (dx, dy) in step S123 shown in FIG. 8. Thus, repeating the explanation is omitted.

(g) In step S231, the coefficient calculation module 13a calculates the coefficients $k_1$ to $k_{20}$ of the first and second displacement correction polynomials (2) and (3), the same as step S131 shown of FIG. 8. In addition, in step S232, the correction information is calculated by the correction information calculation module 13b, the same as step S132 shown of FIG. 8, and the result is stored in the correction information storage unit 9. Since steps S240 and S250 are substantially the same as steps S140 and S150 shown in FIG. 8, repeating the explanation is omitted.

The exposure method according to the second embodiment of the present invention is not limited to the steps S210 to S250. Various types of processes may be provided as the exposure method according to the second embodiment of the present invention.

According to the second embodiment of the present invention, errors attributable to the displacement of the reticle 5 can be corrected, and thereby manufacturing yield can be improved, the same as in the first embodiment. Furthermore, since calculating displacement (d'x, d'y) based on the flatness information of the reticle stage 55 in addition to the curvature information of the reticle 5, errors attributable to the displacement of the reticle 5, taking the flatness of the reticle stage 55 into consideration, can be corrected.

THIRD EMBODIMENT

Figure 12:
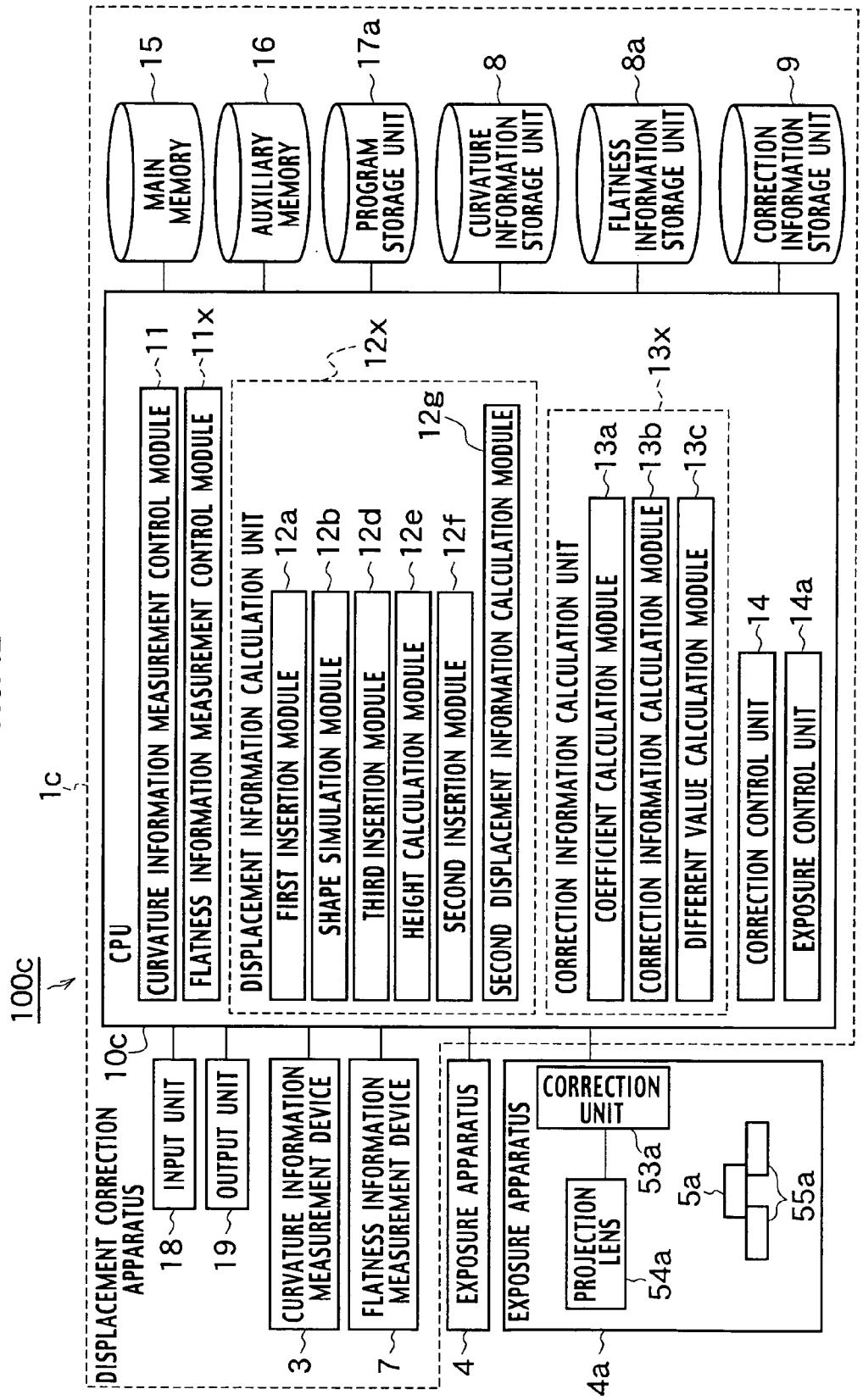
FIG. 12 is a block diagram showing an example of configuration of an exposure system according to a third embodiment of the present invention.

As shown in FIG. 12, an exposure system 100c according to the third embodiment of the present invention includes a displacement correction apparatus 1c and two exposure apparatuses 4 and 4a. In the third embodiment of the present invention, a description will be given of the case of performing mix and match exposure. In mix and match exposure, the reticle 5 is fixed on the reticle stage 55 of the exposure apparatus 4 shown in FIG. 7, and the fixed reticle 5 is exposed (first exposure) to a wafer 56. Then, the reticle 5a is fixed on the reticle stage 55a of the exposure apparatus 4a shown in FIG. 12, and the fixed reticle 5a is exposed (second exposure) to the wafer 56.

The displacement correction apparatus 1c includes a CPU 10c, a curvature information measurement device 3, a flatness information measurement device 7, a curvature information storage unit 8, a flatness information storage unit 8a, a correction information storage unit 9, a main memory 15, an auxiliary memory 16, a program storage unit 17c, an input unit 18, an output unit 19 and a communication control unit 20. The CPU 10c includes a curvature information measurement control module 11, a flatness information measurement control module 11x, a displacement information calculation unit 12x, a correction information calculation unit 13x, a correction control module 14 and an exposure control module 14a.

The curvature information measurement control module 11 outputs an instruction for the curvature information measurement device 3 to measure curvature information of the curved reticle 5 used by the exposure apparatus 4, and the curvature information of the curved reticle 5a used by the exposure apparatus 4a; and an instruction to store the curvature information in the curvature information storage unit 8. The flatness information measurement control module 11x outputs an instruction for the flatness information measurement device 7 to measure flatness information of the reticle stage 55 of the exposure apparatus 4, and flatness information of the reticle stage 55a of the exposure apparatus 4a; and an instruction to store the flatness information in the flatness information storage unit 8a. The displacement information calculation unit 12x also calculates displacement (d'x, d'y) due to curvature which the reticle 5 originally had and which is changed when the reticle 5a is fixedly adhered to the reticle stage 55a, in addition to the displacement (d'x, d'y) of the reticle 5.

The correction information calculation unit 13x further includes a different value calculation module 13c in addition to a coefficient calculation module 13a and a correction information calculation module 13b. The coefficient calculation module 13a calculates coefficients $k_1$ to $k_{20}$ of the first and second displacement correction polynomials (2) and (3) by substituting the displacement (d'x,d'y) of the reticle 5 calculated by the displacement information calculation unit 12x for the first and second displacement correction polynomials (2) and (3). Furthermore, the coefficient calculation module 13a calculates coefficients $k'_1$ to $k'_{20}$ with the third displacement correction polynomial (6) and a fourth displacement correction polynomial (7) intersecting at a right angle to dx, using the displacement (d'x, d'y) of the reticle 5a calculated by the displacement information calculation unit 12x. The calculation by using position coordinates of one of each two arbitrary points for x, y of each term in the respective right-hand side of the third and fourth displacement correction polynomials (6) and (7) being substituted for correcting the projection lens 54a; and displacement (dx, dy) of the one of the arbitrary points is substituted for left-hand side of the third and fourth displacement correction polynomials (6) and (7).

$$dx = k'_1 + xk'_3 + yk'_5 + x^2k'_7 + xyk'_9 + y^2k'_{11} + x^3k'_{13} + x^2yk'_{15} + xy^2k'_{17} + y^3k'_{19} \quad (6)$$

$$dy = k'_2 + yk'_4 + xk'_6 + y^2k'_8 + xyk'_{10} + x^2k'_{12} + y^3k'_{14} + xy^2k'_{16} + x^2yk'_{18} + x^3k'_{19} \quad (7)$$

The different value calculation module 13c calculates different values $k_1-k'_1$, $k_2-k'_2$, ..., $k_{20}-k'_{20}$ by subtracting the coefficients $k'_1$ to $k'_{20}$ of the third and fourth displacement correction polynomials (6) and (7) calculated from coefficients $k_1$ to $k_{20}$ of the first and second displacement correction polynomials (2) and (3). The correction information calculation module 13b calculates correction information for correcting the projection lens 54a of the exposure apparatus 4a based on the different values $k_1-k'_1$, $k_2-k'_2$, ..., $k_{20}-k'_{20}$.

The correction control module 14 outputs an instruction for the correction unit 53 of the exposure apparatus 4a to correct a driving force and a driving position of the projection lens 54a. The exposure control module 14a controls the exposure apparatus 4 to expose a pattern of the reticle 5 with the projection lens 54. Then, the exposure control module 14a controls the exposure apparatus 4a to expose a pattern of the reticle 5a with the projection lens 54a.

The program storage unit 17c stores a displacement correction program for executing applications on the displacement correction apparatus 1c. The displacement correction program includes as an instruction to calculate the different values $k_1-k'_1$, $k_2-k'_2$, ..., $k_{20}-k'_{20}$. Since another part of the exposure system 100c is substantially the same as the exposure system 100a shown in FIG. 9, a repeated explanation is omitted.

A description will be given of an example of an exposure method according to the third embodiment of the present invention referring to FIGS. 12 and 13.

Figure 13:
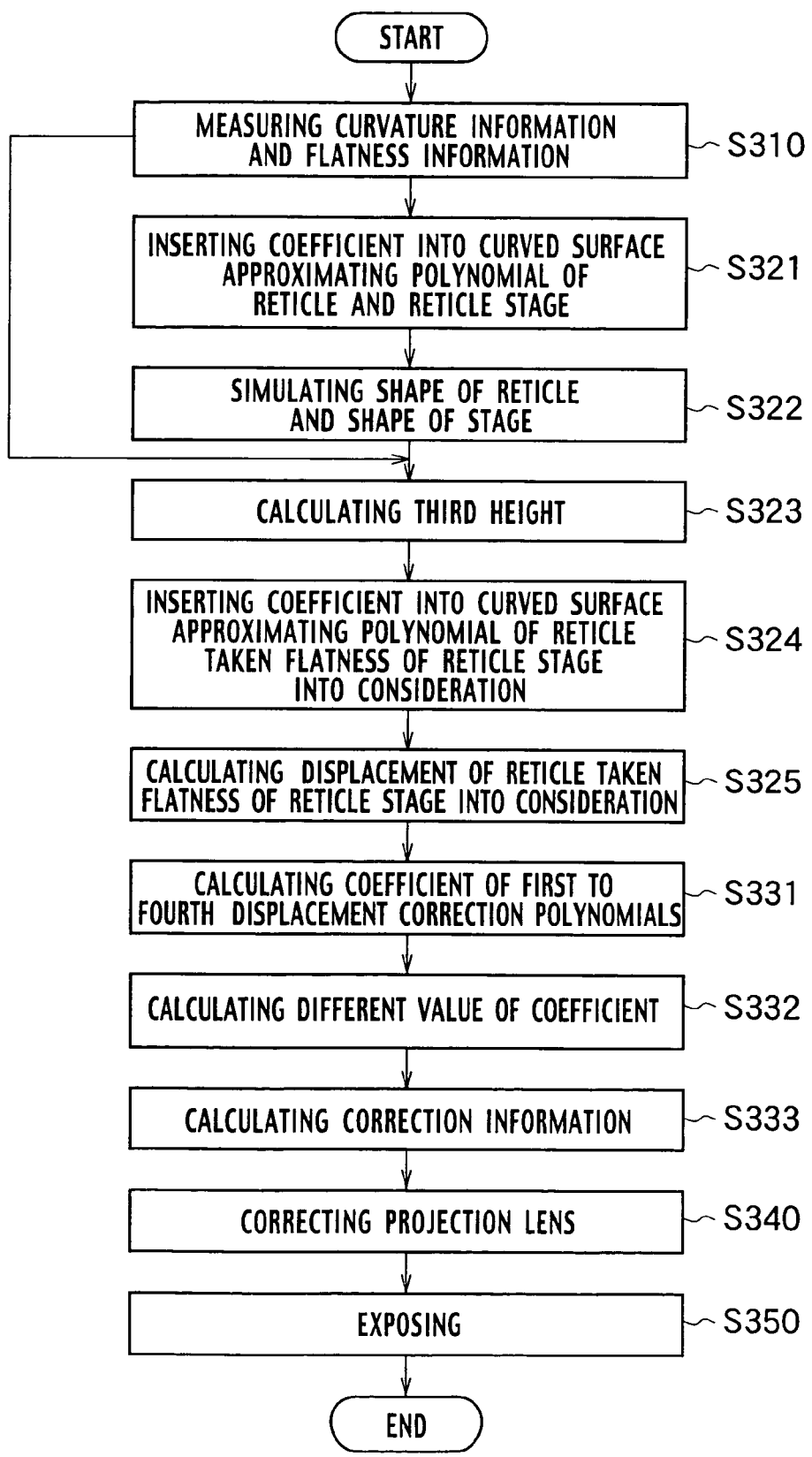
FIG. 13 is a flowchart for explaining an example of an exposure method according to the third embodiment of the present invention.

(a) In step S310 of FIG. 13, the curvature information measurement control module 11 shown in FIG. 12 controls the curvature information measurement device 3 to measure curvature information of the curved reticles 5 and 5a. In addition, the flatness information measurement control module 11x controls the flatness information measurement device 7 to measure flatness information of the reticle stages 55 and 55a.

(b) In step S321 to S325, the displacement information calculation unit 12x calculates the displacement (d'x, d'y) attributable to the original curvature of reticles 5 and 5a fixed on the reticle stages 55 and 55a and flattened, using the curvature information of the curved reticles 5 and 5a, and the flatness information of the reticle stages 55 and 55a. Steps S321 to S325 are different from steps S221 to S225 shown in FIG. 11 with respect to the displacement (d'x, d'y) of the reticle 5a in addition to the displacement (d'x, d'y) of the reticle 5. Since another part of steps S321 to S325 is substantially the same as steps S221 to 225 shown in FIG. 11, a repeated explanation is omitted.

(c) In step S331, the coefficient calculation module 13a calculates coefficients $k_1$ ... $k_{20}$ of the first and second displacement correction polynomials (2) and (3) respectively, using the displacement (d'x, d'y) of the reticle 5 calculated in step S325. Furthermore, the coefficient calculation module 13a calculates coefficients $k'_1$ to $k'_{20}$ of the third and fourth displacement correction polynomials (6) and (7), using the calculated displacement (d'x, d'y) of the reticle 5a.

(d) In step S332, the different value calculation module 13c reads coefficients $k_1$ to $k_{20}$ of the first and second displacement correction polynomials (2) and (3), and coefficients $k'_1$ to $k'_{20}$ of the third and fourth displacement correction polynomials (6) and (7) calculated in step S331, and calculates the different values $k_1-k'_1$, $k_2-k'_2$, ..., $k_{20}-k'_{20}$.

(e) In step S333, the correction information calculation module 13b calculates the correction information for correcting the projection lens 54a of the exposure apparatus 4a using the different values $k_1-k'_1$, $k_2-k'_2$, ..., $k_{20}-k'_{20}$ calculated in step S332, and QC information of the reticle 5 stored in the auxiliary memory 16. The correction information calculated is stored in the correction information storage unit 9.

(f) In step S340, the correction control module 14 controls the correction unit 53a to correct a driving position and a driving force of the projection lens 54 of the exposure apparatus 4a, using the correction information of the projection lens 54a calculated in step S333.

(g) In step S350, the exposure control module 14a drives the exposure apparatus 4 shown in FIG. 7 to firstly expose of a pattern of the reticle 5 fixed on the reticle stage 55 to the wafer 56 with the projection lens 54. Then, the exposure control module 14a drives the exposure apparatus 4a to secondary expose of a pattern of the reticle 5a fixed on the reticle stage 55a to the wafer 56 with the projection lens 54a corrected. Since the projection lens 54a has been corrected, the pattern of the reticles 5 and 5a can be transferred without errors attributable to curvature of the reticles 5 and 5a.

According to the third embodiment of the present invention, errors attributable to the displacement (d'x, d'y) generated when the reticles 5 and 5a are fixed on the reticle stages 55 and 55a can be corrected before exposure with the exposure apparatus 4a, also when performing mix and match exposure using two exposures 4 and 4a and the reticles 5 and 5a fixed on the reticle stages 55 and 55a. Therefore, manufacturing yield can be improved.

FOURTH EMBODIMENT

Figure 14:
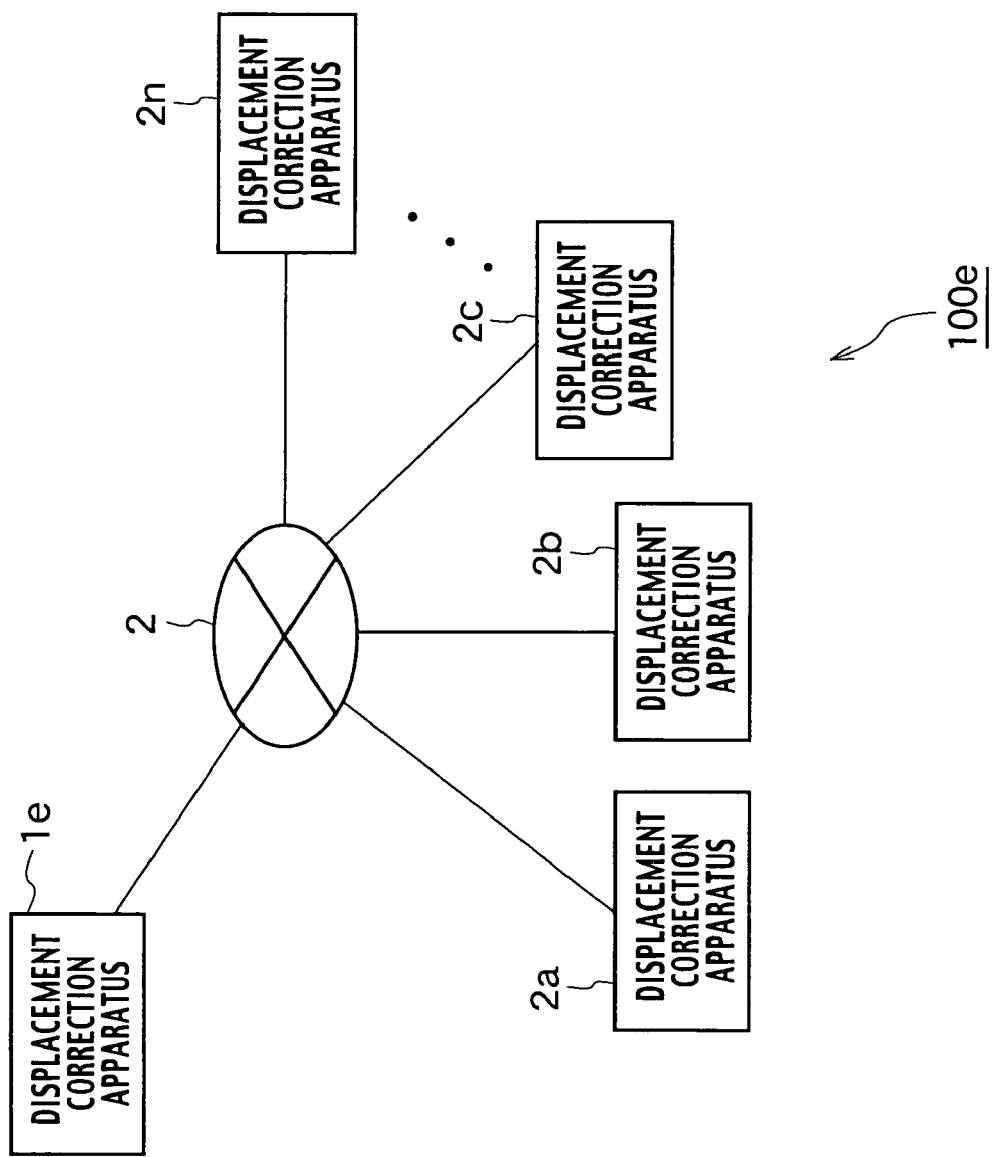
FIG. 14 is a block diagram showing an example of a configuration of an exposure system according to a fourth embodiment of the present invention.

Instead of the bundle exposure system described in the first to third embodiments, plural apparatuses located a distant location from each other may cooperate through a communication network. As shown in FIG. 14, an exposure system 100e according to the fourth embodiment includes a centrally located displacement correction apparatus 1e, a displacement correction apparatus 2a located at a first factory, a displacement correction apparatus 2b located at a second factory side, a displacement correction apparatus 2c located at a third factory side . . . , and a displacement correction apparatus 2n located at a n-th factory. The displacement correction apparatus 1e and the displacement correction apparatuses 2a to 2n can connect each other through a communication network 2. As the communication network 2, the Internet or an intranet can be used.

Figure 15:
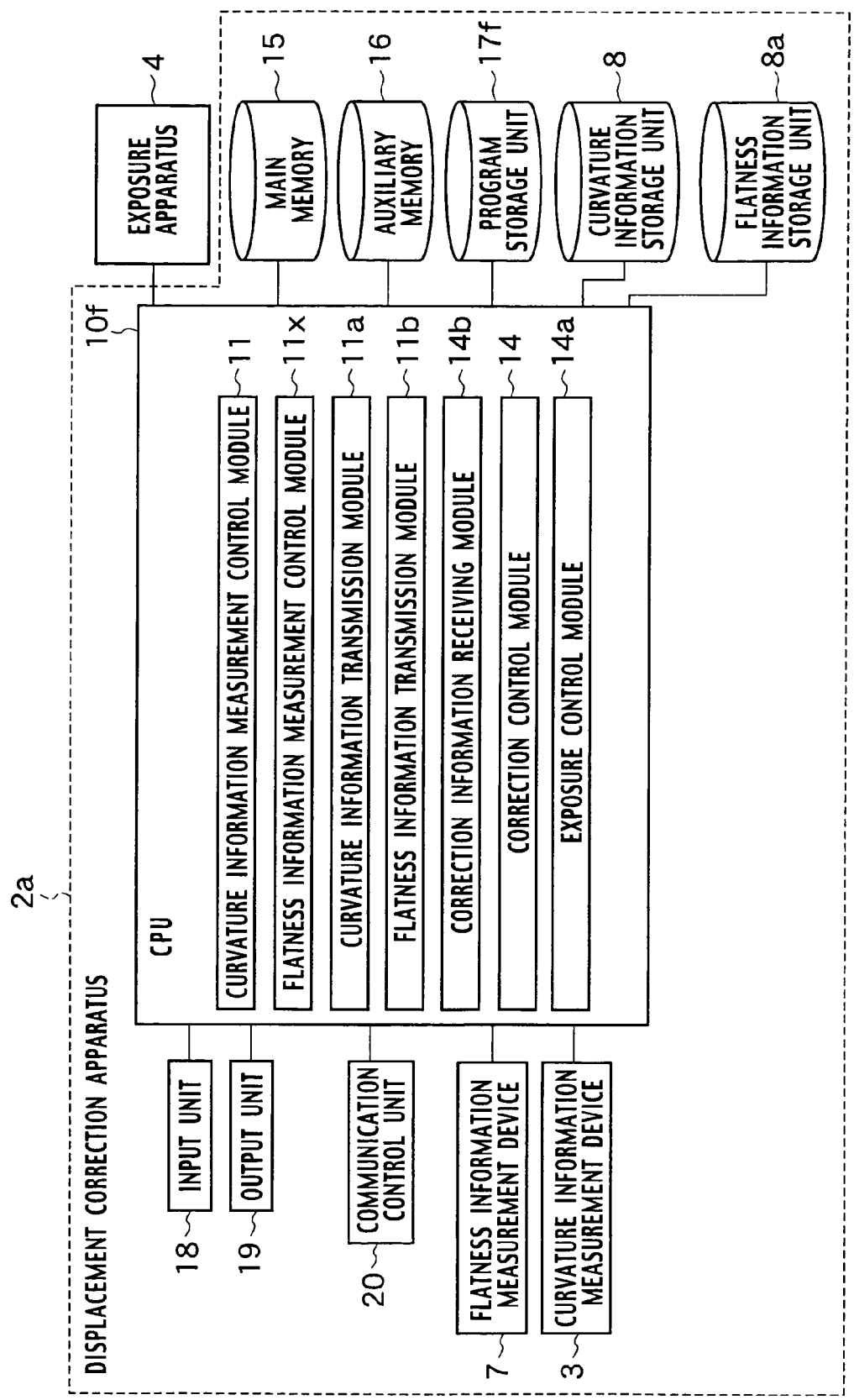
FIG. 15 is a block diagram showing a configuration of a part of the exposure system according to the fourth embodiment of the present invention.

As shown in FIG. 15, the displacement correction apparatus 2a located at the first factory includes a CPU 10f, a curvature information measurement device 3, a flatness information measurement device 7, a curvature information storage unit 8, a flatness information storage unit 8a, a main memory 15, a program storage unit 17f, an input unit 18, an output unit 19 and a communication control unit 20. An exposure apparatus 4 is connected to the displacement correction apparatus 2a.

The CPU 10f includes a curvature information measurement control unit 11, a flatness information measurement control module 1x, a curvature information transmission module 11a, a flatness information transmission module 11b, a correction information receiving module 14b, a correction control module 14 and an exposure control module 14a.

The curvature information transmission module 11a transmits curvature information of a curved reticle used by the exposure apparatus 4 to the centrally located displacement correction apparatus 1e through the communication network 2 shown in FIG. 14. In addition, the flatness information transmission module 11b transmits flatness information of a reticle stage of the exposure apparatus 4 to the centrally located displacement correction apparatus 1e through the communication network 2. The correction information receiving module 14b receives correction information from the displacement correction apparatus 1e through the communication network 2. The communication control unit 20 controls communication relating to the displacement correction apparatus 2a through the communication network 2. The program storage unit 17f stores a displacement correction program for executing applications on the displacement correction apparatus 2a. The displacement correction program includes an instruction to transmit the curvature information of a curved reticle; an instruction to receive the correction information; and the like. Since the configuration of the displacement correction apparatuses 2b to 2n located at the second to n-th factories is similar to the displacement correction apparatus 2a, a repeated explanation is omitted.

Figure 16:
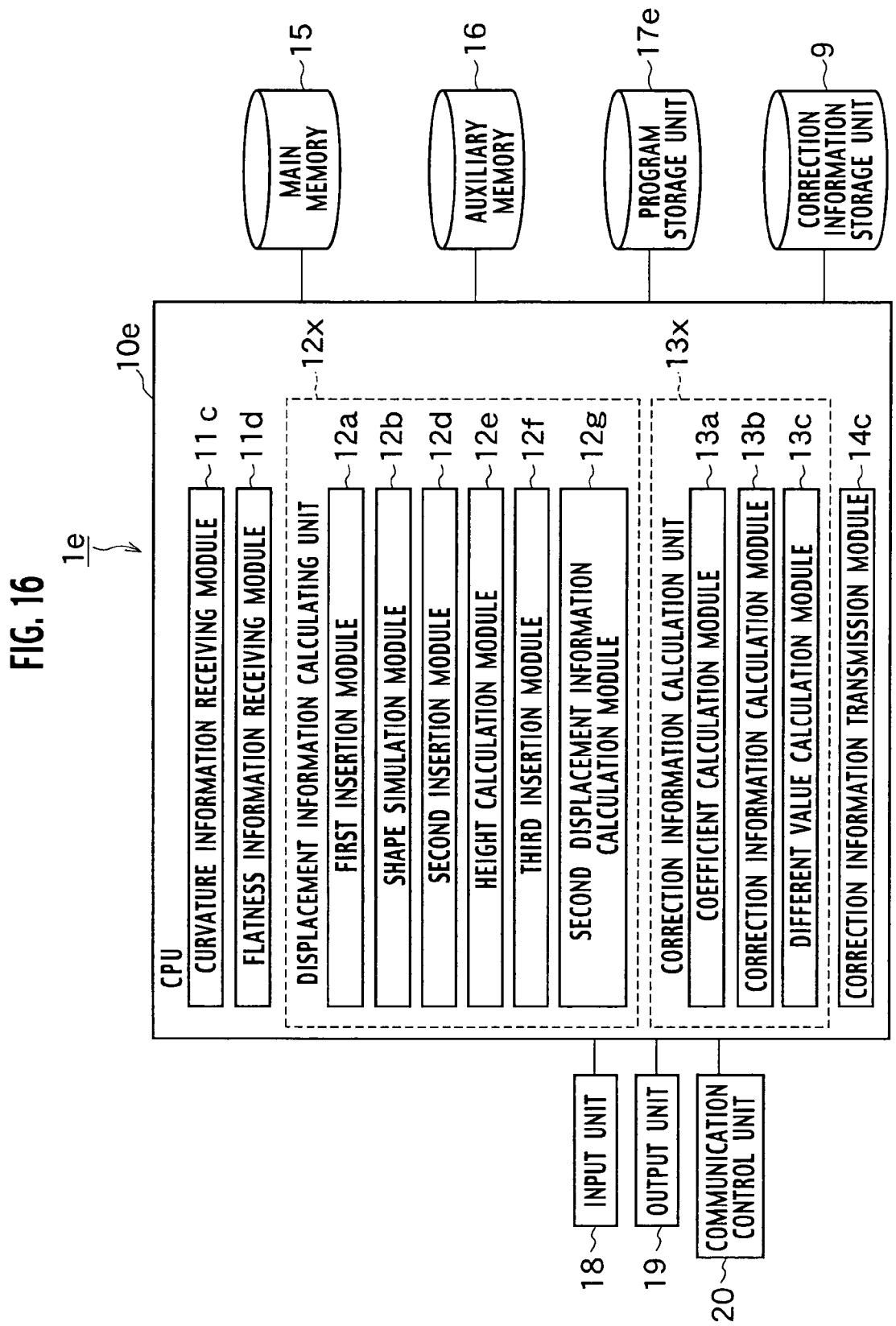
FIG. 16 is a block diagram showing a configuration of another part of the exposure system according to the forth embodiment of the present invention.

As shown in FIG. 16, the centrally located displacement correction apparatus 1e shown in FIG. 14 includes a CPU 10e, a correction information storage unit 9, a main memory 15, an auxiliary memory 16, a program storage unit 17e, an input unit 18, an output unit 19 and a communication control unit 20. The CPU 10e includes a curvature information receiving module 11c, a flatness information receiving module 11d, a displacement information calculation unit 12x, a correction information calculation unit 13x, and the correction information transmission module 14c.

The curvature information receiving module 11c receives curvature information of a curved reticle from the displacement correction apparatuses 2a to 2n located at the first to n-th factories respectively through the communication network 2. The flatness information receiving module 11d receives flatness information of a reticle stage from the displacement correction apparatuses 2a to 2n located at the first to n-th factories respectively through the communication network 2.

The displacement information calculation unit 12x calculates displacement information of reticles used in exposure processes in the respective first to n-th factories. The correction information calculation unit 13x calculates correction information for correcting projection lens of exposure apparatus in the first to n-th factories, and stores the correction information to the correction information storage unit 9. The correction information transmission module 14c feeds back the correction information of the projection lens to the displacement correction apparatuses 2a to 2n located at the first to n-th factories through the communication network 2. The program storage unit 17e stores a displacement correction program for executing applications on the displacement correction apparatus 1e. The displacement correction program includes an instruction to receive the curvature information of the curved reticles; an instruction to receive flatness information of reticle stages, and the like.

A description will be given of an example of an exposure method according to the fourth embodiment of the present invention referring to FIGS. 14 to 16. Here, the description will be given referring to the displacement correction apparatus 2a shown in FIG. 15. The displacement correction apparatuses 2b to 2n are omitted as they perform same as the displacement correction apparatus 2a.

(a) Same as the step S210 shown in FIG. 11, in the displacement correction apparatus 2a located at the first factory shown in FIG. 15, the curvature information measurement control unit 11 controls the curvature information measurement device 3 to measure curvature information of a curved reticle, and to store the curvature information in the curvature information storage unit 8. In addition, the flatness information measurement control module 11x controls the flatness information measurement device 7 to measure flatness information of a reticle stage, and to store the flatness information in the flatness information storage unit 8a.

(b) Thereafter, the curvature information transmission module 11a transmits the curvature information of the curved reticle using by the exposure apparatus 4 to the centrally located displacement correction apparatus 1e shown in FIG. 14 through the communication network 2. In addition, the flatness information transmission module 11b transits the flatness information of the reticle stage of the exposure apparatus 4 to the centrally located displacement correction apparatus 1e through the communication network 2.

(c) Next, in the centrally located displacement correction apparatus 1e shown in FIG. 14, the curvature information receiving module 11c receives the curvature information of the curved reticles from the displacement correction apparatuses 2a to 2n located at the first to n-th factories through the communication network 2. The flatness information receiving module 11d receives the flatness information of reticle stages from the displacement correction apparatuses 2a to 2n located at the first to n-th factories through the communication network 2.

(d) Same as the steps S221 to S232 shown in FIG. 11, the displacement information calculation unit 12x calculates displacement of the reticles used in exposure processes in the first to n-th factories. The correction information calculation unit 13x calculates correction information for correcting projection lens of exposure apparatuses in the first to n-th factories, and stores the correction information to the correction information storage unit 9.

(e) Next, the correction information transmission module 14c feeds back the correction information of the projection lens to the displacement correction apparatuses 2a to 2n located at the first to n-th factories through the communication network 2 shown in FIG. 14. In the displacement correction apparatus 2a located at the first factory shown in FIG. 15, the correction information receiving module 14b receives the correction information from the displacement correction apparatus 1e through the communication network 2.

(f) Same as the steps S240 to S250 shown in FIG. 11, the correction control module 14 controls a correction unit, omitted from illustration of the exposure apparatus 4, to correct driving force and driving position of the projection lens, omitted from illustration. Moreover, the exposure control module 14a controls the exposure apparatus 4 to perform exposure with the corrected projection lens.

According to the fourth embodiment of the present invention, errors attributable to the displacement generated when the reticle is fixed on the reticle stage in a plurality of factories can be corrected respectively, and manufacturing yield can be improved.

OTHER EMBODHIMENTS

In the above-described first to fourth embodiments, a cubic equation, a biquadratic equation, a fifth or n-th degree polynomial can be used as the curved surface approximating polynomial (1) of the reticle, the curved surface approximating polynomial (4) of the reticle stage, the curved surface approximating polynomial (5) of the reticle taking the reticle stage into consideration, instead of a quadratic polynomial. Furthermore, a fourth, fifth, or n-th degree polynomial can be used as the first to fourth displacement correction polynomials (2) and (3), (6) and (7), instead of a third degree polynomial.

Furthermore, in the fourth embodiment of the present invention, the number of the displacement correction apparatuses 2a to 2n located at the first to n-th factories, and the number of exposure apparatuses in the displacement correction apparatuses 2a to 2n is not limited. Various factories, such a semiconductor device manufacturer, an exposure apparatus manufacturer, and a reticle manufacturer can be respective factories.

Furthermore, in the first to fourth embodiments of the present invention, steps from measuring steps such as the curvature information of the curved reticle 5 and the flatness information of the reticle stage 55, to exposure by the exposure apparatus 4 need not to be done in succession. For example, the measured curvature information of the curved reticle may be previously stored in the curvature information storage unit 8 shown in FIG. 1. Then, elements such as the first insertion module 12a can read the curvature information and the calculate correction information of the projection lens 54, and then store the correction information to the correction information storage unit 9. Furthermore, the correction information stored in the correction information storage unit 9 can be read as needed, such as at the exposure process.

In the second to fourth embodiments of the present invention, the displacement (d'x, d'y) due to unevenness and inclination of the reticle stage 55 when the reticle 5, which is supposed to be completely flat when fixed on the reticle stage 55 can also be calculated based on just the flatness information of the reticle stage 55 without the curvature information. However, the curved surface approximating polynomial (1) of the reticle 5 can be expressed as the following equation (8) that is strictly a function of depth (depth of focus). Therefore, it is preferable to measure depth corresponding to the depth of exposure condition of exposure apparatus.

$$z(T)=a_1(T)x^2+b_3(T)y^2+c_3(T)xy+d_3(T)x+e_3(T)y+f_3(T) \qquad (8)$$

Various modifications will become possible for those skilled in the art after receiving the teachings of the present disclosure without departing from the scope thereof.

What is claimed is:

1. A displacement correction apparatus comprising:
   a curvature information storage unit configured to store curvature information of a reticle;
   a first insertion module configured to insert coefficients into a curved surface approximating polynomial of the reticle based on the curvature information;
   a first displacement information calculation module configured to calculate displacement generated in the reticle being fixed on a reticle stage of an exposure apparatus based on the curved surface approximating polynomial of the reticle; and a correction information calculation unit configured to calculate correction information correcting a projection lens of the exposure apparatus based on the displacement.

2. A displacement correction apparatus, comprising:
a curvature information storage unit configured to store curvature information of a reticle;
a displacement information calculation unit configured to calculate displacement generated in the reticle being fixed on a reticle stage of an exposure apparatus based on the curvature information;
a coefficient calculation module configured to calculate coefficients of a displacement correction polynomial correcting a projection lens of the exposure apparatus based on the displacement; and
a correction information calculation module configured to calculate correction information correcting the projection lens based on the coefficients of the displacement correction polynomial.

3. A displacement correction apparatus, comprising:
a curvature information storage unit configured to store a first height measured between a surface of a reticle and a first reference plane set for the reticle and a position coordinate on a surface of the reticle at which the first height is measured;
a height calculation module configured to calculate a third height by subtracting a second height measured between a surface of a reticle stage of an exposure apparatus and a second reference plane set for the reticle stage from the first height;
a second insertion module configured to insert coefficients into a curved surface approximating polynomial of the reticle by considering the flatness of the reticle stage, using the third height and a position coordinate on the surface of the reticle stage at which the first and second heights are measured;
a second displacement information calculation module configured to calculate displacement generated in the reticle being fixed on the reticle stage, using a curved surface approximating polynomial of the reticle taking the flatness of the reticle stage into consideration; and
a correction information calculation unit configured to calculate correction information correcting a projection lens of the exposure apparatus based on the displacement.

4. An exposure system, comprising:
an exposure apparatus; and
a displacement correction apparatus, comprising
a curvature information storage unit configured to store curvature information of a reticle,
a first insertion module configured to insert coefficients into a curved surface approximating polynomial of the reticle based on the curvature information,
a first displacement information calculation module configured to calculate displacement generated in the reticle being fixed on a reticle stage of an exposure apparatus based on the curved surface approximating polynomial of the reticle; and
a correction information calculation unit configured to calculate correction information correcting a projection lens of the exposure apparatus based on the displacement.

5. An exposure system, comprising:
an exposure apparatus; and
a displacement correction apparatus, comprising
a curvature information storage unit configured to store curvature information of a reticle;
a displacement information calculation unit configured to calculate displacement generated in the reticle being fixed on a reticle stage of an exposure apparatus based on the curvature information;
a coefficient calculation module configured to calculate coefficients of a displacement correction polynomial correcting a projection lens of the exposure apparatus based on the displacement; and
a correction information calculation module configured to calculate correction information correcting the projection lens based on the coefficients of the displacement correction polynomial.

6. An exposure system, comprising:
an exposure apparatus; and
a displacement correction apparatus comprising:
a curvature information storage unit configured to store information of a first height measured between a surface of a reticle and a first reference plane and a position coordinate on a surface of the reticle at which the first height is measured;
a height calculation module configured to calculate a third height, subtracting a second height measured between a surface of a reticle stage of an exposure apparatus and a second reference plane set for the reticle stage from the first height;
a second insertion module configured to insert coefficients into a curved surface approximating polynomial of the reticle by considering the flatness of the reticle stage, using the third height and a position coordinate on the surface of the reticle stage at which the first and second heights are measured;
a second displacement information calculation module configured to calculate displacement generated in the reticle being fixed on the reticle stage, using a curved surface approximating polynomial of the reticle taking the flatness of the reticle stage into consideration; and
a correction information calculation unit configured to calculate correction information correcting a projection lens of the exposure apparatus based on the displacement.

7. An exposure method, comprising:
measuring curvature information of a reticle;
inserting coefficients into a curved surface approximating polynomial of the reticle based on the curvature information;
calculating a displacement generated in the reticle being fixed on a reticle stage of an exposure apparatus based on the curved surface approximating polynomial of the reticle;
calculating correction information correcting projection lens of the exposure apparatus, using the displacement;
correcting the projection lens by using the correction information; and
exposing the reticle fixed on the reticle stage to a wafer, using the projection lens corrected.

8. An exposure method, comprising:
measuring a first height between a surface of a reticle and a first reference plane set for the reticle and a position coordinate on a surface of the reticle at which the first height is measured;
calculating a third height by subtracting a second height measured from a surface of a reticle stage of an exposure apparatus and a second reference plane set for the reticle stage from the first height;
inserting coefficients into a curved surface approximating polynomial of the reticle by considering the flatness of the reticle stage, using the third height and a position coordinate on the surface of the reticle stage measured at which the first and second heights are measured;

calculating displacement generated in a changed shape of the reticle being fixed on the reticle stage, using a curved surface approximating polynomial of the reticle taking the flatness of the reticle stage into consideration;

calculating correction information correcting projection lens of the exposure apparatus, using the displacement;

correcting the projection lens by using the correction information; and exposing the reticle fixed on the reticle stage to a wafer, using the projection lens corrected.

9. A computer program product, embedded in a computer readable medium, for executing an application on a displacement correction apparatus, the computer program product comprising:

instructions for reading curvature information of a reticle from a curvature information storage unit;

instructions for inserting coefficients into a curved surface approximating polynomial of the reticle based on the curvature information;

instructions for calculating displacement generated in the reticle being fixed on a reticle stage of an exposure apparatus based on the curved surface approximating polynomial of the reticle;

instructions for calculating correction information correcting a projection lens of the exposure apparatus, using the displacement; and instructions for storing the correction information in a correction information storage unit.

* * * * *